(12) United States Patent
Sawada et al.

(10) Patent No.: US 6,429,400 B1
(45) Date of Patent: Aug. 6, 2002

(54) PLASMA PROCESSING APPARATUS AND METHOD

(75) Inventors: Yasushi Sawada, Neyagawa; Keiichi Yamazaki, Nara; Yoshitami Inoue, Neyagawa; Sachiko Okazaki, Tokyo; Masuhiro Kogoma, Wako, all of (JP)

(73) Assignee: Matsushita Electric Works Ltd., Osaka (JP)

(*) Notice: Subject to any disclaimer, the term of this patent is extended or adjusted under 35 U.S.C. 154(b) by 0 days.

(21) Appl. No.: 09/667,437

(22) Filed: Sep. 22, 2000

Related U.S. Application Data

(63) Continuation-in-part of application No. 09/203,478, filed on Dec. 2, 1998, now abandoned.

(30) Foreign Application Priority Data

Dec. 3, 1997 (JP) .............................................. 9-333325

(51) Int. Cl.⁷ .............................................. B23K 10/00
(52) U.S. Cl. .......................... 219/121.52; 219/121.43; 219/121.58; 219/121.49; 315/111.51
(58) Field of Search .................. 219/121.59, 121.4, 219/121.43, 121.49, 121.52, 121.36; 313/231.41, 231.51; 315/111.51

(56) References Cited

U.S. PATENT DOCUMENTS

| | | |
|---|---|---|
| 5,185,132 A | 2/1993 | Horiike et al. |
| 5,198,724 A | 3/1993 | Koinuma et al. |
| 5,221,427 A | 6/1993 | Koinuma |
| 5,304,407 A | 4/1994 | Hayashi et al. |
| 5,369,336 A | 11/1994 | Koinuma et al. |
| 5,414,324 A | 5/1995 | Roth et al. |
| 5,549,780 A | 8/1996 | Koinuma et al. |
| 5,578,130 A | 11/1996 | Hayashi et al. |
| 5,648,000 A | 7/1997 | Yamazaki |
| 5,688,415 A | 11/1997 | Bollinger et al. |

FOREIGN PATENT DOCUMENTS

| | | |
|---|---|---|
| JP | 1-306569 | 12/1989 |
| JP | 2-015171 | 1/1990 |
| JP | 3-241739 | 10/1991 |
| JP | 4-242924 | 8/1992 |

(List continued on next page.)

OTHER PUBLICATIONS

English Language Abstract of JP 1–306569.
English Language Abstract of JP 2–015171.
English Language Abstract of JP 3–241739.
English Language Abstract of JP 4–242924.

(List continued on next page.)

Primary Examiner—Mark Paschall
(74) Attorney, Agent, or Firm—Greenblum & Bernstein, P.L.C.

(57) ABSTRACT

A plasma processing apparatus for performing plasma processing of an article, comprising: a central electrode; a tubular outer electrode which is provided so as to surround the central electrode; a tubular reaction pipe which is disposed between the central electrode and the outer electrode so as to electrically insulate the central electrode and the outer electrode from each other; a gas supply device for supplying a plasma producing gas to a discharge space defined between the central electrode and the outer electrode in the reaction pipe; an AC power source for applying an AC voltage between the central electrode and the outer electrode; wherein not only the plasma producing gas is supplied to the discharge space by the gas supply device but the AC voltage is applied between the central electrode and the outer electrode by the AC power source so as to generate a glow discharge in the discharge space under atmospheric pressure such that a plasma jet is blown to the article from a blow-off outlet of the reaction pipe; and a cooling device for cooling the central electrode and the outer electrode.

24 Claims, 21 Drawing Sheets

FOREIGN PATENT DOCUMENTS

| | | |
|---|---|---|
| JP | 4-358076 | 12/1992 |
| JP | 5-275190 | 10/1993 |
| JP | 5-275191 | 10/1993 |
| JP | 5-275193 | 10/1993 |
| JP | 6-108257 | 4/1994 |
| JP | 6-096718 | 8/1994 |
| JP | 6-251894 | 9/1994 |
| JP | 7-029892 | 1/1995 |
| JP | 7-211654 | 8/1995 |
| JP | 2589599 | 3/1997 |
| JP | 9-213685 | 8/1997 |
| JP | 2657850 | 9/1997 |
| JP | 10199697 | 7/1998 |

OTHER PUBLICATIONS

English Language Abstract of JP 4–358076.
English Language Abstract of JP 5–275190.
English Language Abstract of JP 5–275191.
English Language Abstract of JP 5–275193.
English Language Abstract of JP 6–108257.
English Language Abstract of JP 6–251894.
English Language Abstract of JP 7–211654.
English Language Abstract of Laid–Open Publication (No. 3–219082).
English Language Abstract of Laid–Open Publication (No. 4–212253).
English Language Abstract of JP 10–199697.
English Language Abstract of JP 9–213685.
English Language Abstract of JP 7–029892.
English Language Abstract of JP 6–096718.
Kensuke Taniguchi et al., "Photoresist Ashing by Atmospheric Pressure Glow Plasma", Journal of Photopolymer Science and Technology, vol. 10, No. 1, pp. 113–118, 1997.
Roberts et al., Measurements on the NIST GEC Reference Cell, Proc. SPIE Int. Soc. Opt. Eng., vol. 1392, pp. 428–236 (1990), XP002097801.

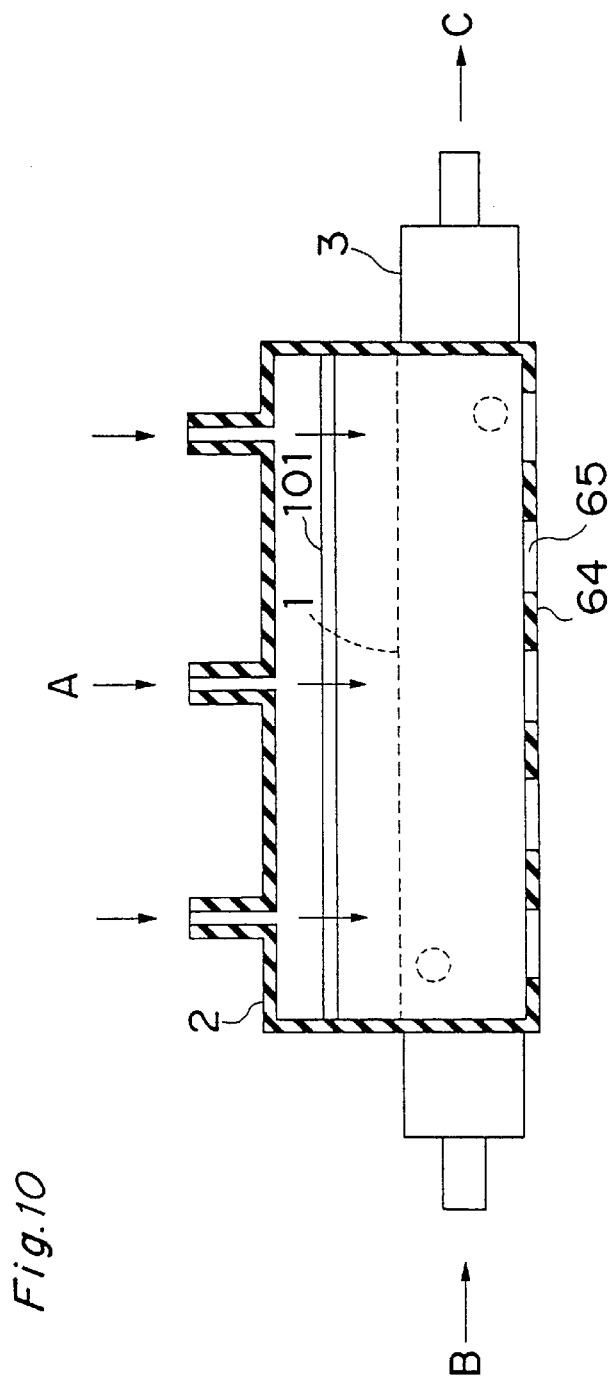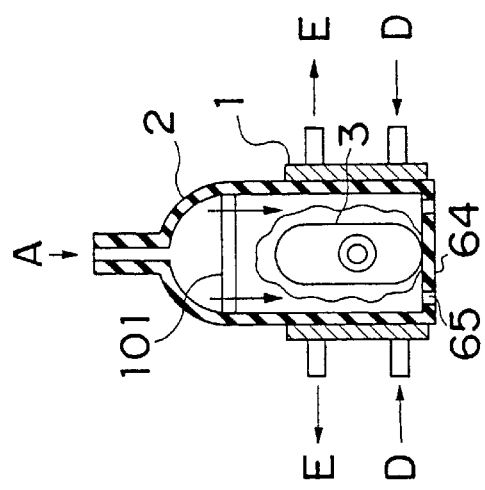

PLASMA PROCESSING APPARATUS AND METHOD

This is a continuation-in-part of U.S. patent application Ser. No. 09/203,478, filed Dec. 2, 1998, now abandoned, the contents of which are expressly incorporated by reference herein its entirety.

BACKGROUND OF THE INVENTION

1. Field of the Invention

The present invention relates a plasma processing apparatus for performing plasma processing such as cleaning of foreign matter, for example, organic substance existing on a surface of an article, separation of a resist, etching of an organic film, reduction of a metallic oxide, a film formation and surface modification and a plasma processing method employing the plasma processing apparatus. The plasma processing apparatus and the plasma processing method are applicable to cleaning of a surface of an electronic component.

2. Description of the Prior Art

Conventionally, an attempt to perform plasma processing under atmospheric pressure has been made. For example, Japanese Patent Laid-Open Publication Nos. 2-15171 (1990), 3-241739 (1991) and 1-306569 (1989) disclose a plasma processing method in which a pair of electrodes are disposed in a discharge space in a reaction vessel and a dielectric member is provided between the electrodes such that the discharge space is filled with plasma producing gas mainly consisting of rare gas such as helium and argon. An article to be processed is inserted into the reaction vessel. When an AC voltage is applied between the electrodes, glow discharge is induced so as to produce plasma in the reaction vessel through excitation of the plasma producing gas such that the article is subjected to plasma processing by the plasma.

However, this known plasma processing method has such drawbacks that it is difficult to perform plasma processing of a specific portion of the article and a long time is required for plasma processing. Thus, by developing the known plasma processing method, plasma processing in which plasma produced under atmospheric pressure by glow discharge, especially active species of the plasma is jettingly blown to an article to be processed is proposed in, for example, Japanese Patent Laid-Open Publication Nos. 4-358076 (1992), 3-219082 (1991), 4-212253 (1992) and 6-108257 (1994).

In the above mentioned prior art plasma processing method employing the plasma jet, if frequency of AC in use is less than 10 kHz, quantity of generated radicals is reduced and thus, effects of plasma processing are lessened. Therefore, in the prior art processing method, since AC having a frequency of 10 to several tens MHz is used, such a problem arises that the article is oxidized or carbonized due to extreme rise of temperature of the plasma gas, thereby resulting in thermal damage to the article.

Plasma is heated by repetition of collision of gas particles through discharge. Since average free path of gas particles in plasma induced under atmospheric pressure is smaller than that in plasma induced under reduced pressure, frequency of collision of gas particles in the plasma induced under atmospheric pressure becomes higher than that in the plasma induced under reduced pressure, so that temperature of the plasma induced under atmospheric pressure rises extremely. Meanwhile, frequency of collision of gas particles in plasma is closely dependent also on frequency of applied AC and increases further as frequency of applied AC becomes higher, thereby resulting in extremely high temperature of the plasma in a reaction region. Therefore, if frequency of applied AC becomes higher, quantity of radicals and ions in the plasma increases further but temperature of a reaction pipe and electrodes, especially an electrode in the reaction pipe, whose heat is less likely to be dissipated is raised by the high-temperature plasma, so that heat of the electrode in the reaction pipe is, in turn, conducted to the plasma and thus, temperature of the plasma is raised excessively. Moreover, such a disadvantage is incurred that temperature of the electrode in the reaction pipe approximately reaches its melting point according to kinds of metal of the electrode in the reaction pipe and thus, the electrode in the reaction pipe is corroded and volatilized so as to be deposited on the article.

In addition, in the above mentioned prior art plasma processing method employing the plasma jet, such an inconvenience is incurred that streamer discharge is readily induced towards the article so as to damage a surface of the article.

Process of induction of streamer discharge is described below with reference to FIGS. 24 and 25 showing a conventional plasma processing apparatus. The conventional plasma processing apparatus includes a tubular reaction pipe 2, an outer electrode 1 fitted around the reaction pipe 2 and a central electrode 3 disposed in the reaction pipe 2. When not only plasma producing gas is introduced into the reaction pipe 2 but an AC voltage is applied between the outer electrode 1 and the central electrode 3, glow discharge is generated in the reaction pipe 2 so as to produce plasma in the reaction pipe 2 through excitation of the plasma producing gas. The plasma is blown, as a plasma jet, from a blow-off outlet 21 of the reaction pipe 2 to an article 7 such that the article 7 is subjected to plasma processing.

In this conventional plasma processing apparatus, one cause of induction of a streamer discharge 170 of FIG. 25 is that temperature of inside of the reaction pipe 2 and the outer electrode 1 is raised by the high-temperature plasma mainly through heat transfer. Namely, since local temperature rise of a space between the outer electrode 1 and the central electrode 3, i.e. a discharge space 22 causes partial emission of electrons, electrons flow so as to be concentrated at the portion. Another cause of induction of the streamer discharge 170 is that the argon in the plasma producing gas is high in concentration. Namely, since diffusion rate and thermal conductivity of helium are high, helium mitigates local temperature rise. On the other hand, diffusion rate and thermal conductivity of argon are low. Therefore, as argon in the plasma producing gas becomes higher in concentration, heat dissipation property in space deteriorates further.

More specifically, electrons are initially concentrated at portions of surfaces of the reaction pipe 2 and the central electrode 3. Then, streamers 167 are induced between these portions of the surfaces of the reaction pipe 2 and the central pipe 3 as shown in FIG. 24. Once such streamers 167 are induced, stable glow discharge, i.e. stable plasma is no longer induced and thus, it is impossible to perform plasma processing satisfactorily. Furthermore, the streamer discharge 170 is induced not only between the outer electrode 1 and the central electrode 3 but between the central electrode 3 and the article 7 as shown in FIG. 25 so as to damage a surface of the article 7.

In the above mentioned prior art plasma processing method in which plasma processing is performed under atmospheric pressure by employing the plasma jet, if frequency of AC is raised so as to enhance processing effects, the article 7 sustains thermal damage or damage due to the streamer discharge 170. However, if frequency of AC is lowered in order to prevent such damages to the article 7, processing effects are lessened. These disadvantages constitute a serious obstacle to plasma processing of the article 7, for example, various materials including thermally weak organic substance, readily oxidizable metals such as silver and copper and readily fusible solder as well as an electronic component including an IC chip.

SUMMARY OF THE INVENTION

Accordingly, an essential object of the present invention is to provide, with a view to eliminating the above described drawbacks of prior art, a plasma processing apparatus and a plasma processing method employing the plasma processing apparatus, which are capable of performing plasma processing of an article by lessening thermal damage to the article and damage to the article caused by streamer discharge.

In order to accomplish this object of the present invention, a plasma processing apparatus for performing plasma processing of an article, according to the present invention comprises: a central electrode; a tubular outer electrode which is provided so as to surround the central electrode; a tubular reaction pipe which is disposed between the central electrode and the outer electrode so as to electrically insulate the central electrode and the outer electrode from each other; a gas supply means for supplying a plasma producing gas to a discharge space defined between the central electrode and the outer electrode in the reaction pipe; an AC power source for applying an AC voltage between the central electrode and the outer electrode; wherein not only the plasma producing gas is supplied to the discharge space by the gas supply means but the AC voltage is applied between the central electrode and the outer electrode by the AC power source so as to generate a glow discharge in the discharge space under atmospheric pressure such that a plasma jet is blown to the article from a blow-off outlet of the reaction pipe; and a cooling means for cooling the central electrode and the outer electrode.

BRIEF DESCRIPTION OF THE DRAWINGS

This object and features of the present invention will become apparent from the following description taken in conjunction with the preferred embodiment(s) thereof with reference to the accompanying drawings in which:

FIG. 10 is a longitudinal sectional view of a further modified plasma processing apparatus of the present invention;

FIG. 11 is a partly broken side elevational view of the further modified plasma processing apparatus of FIG. 10;

Before the description of the present invention proceeds, it is to be noted that like parts are designated by like reference numerals throughout several views of the accompanying drawings.

DETAILED DESCRIPTION OF THE INVENTION

Figure 1:
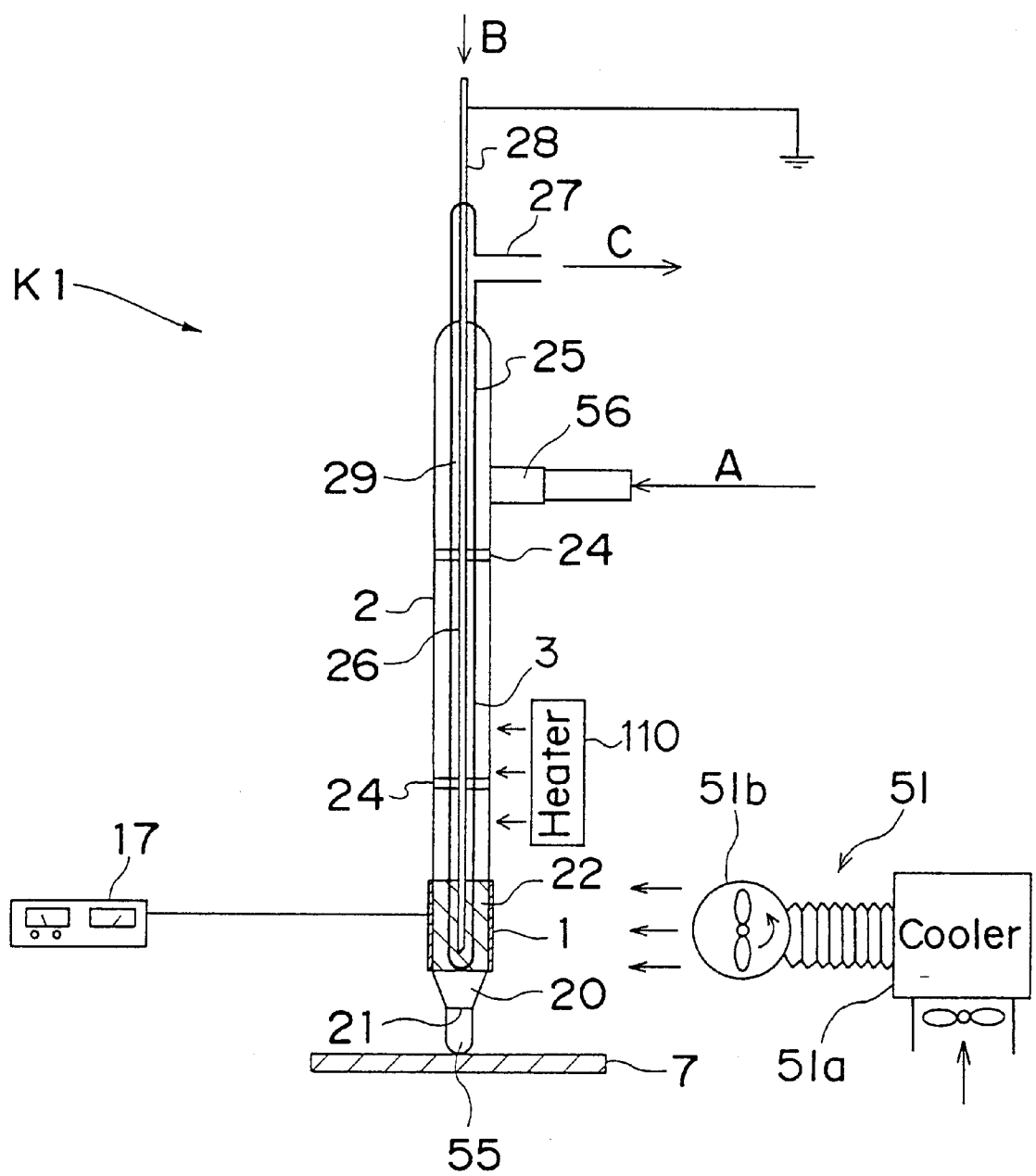
FIG. 1 is a sectional view of a plasma processing apparatus according to a first embodiment of the present invention.
Figure 2:
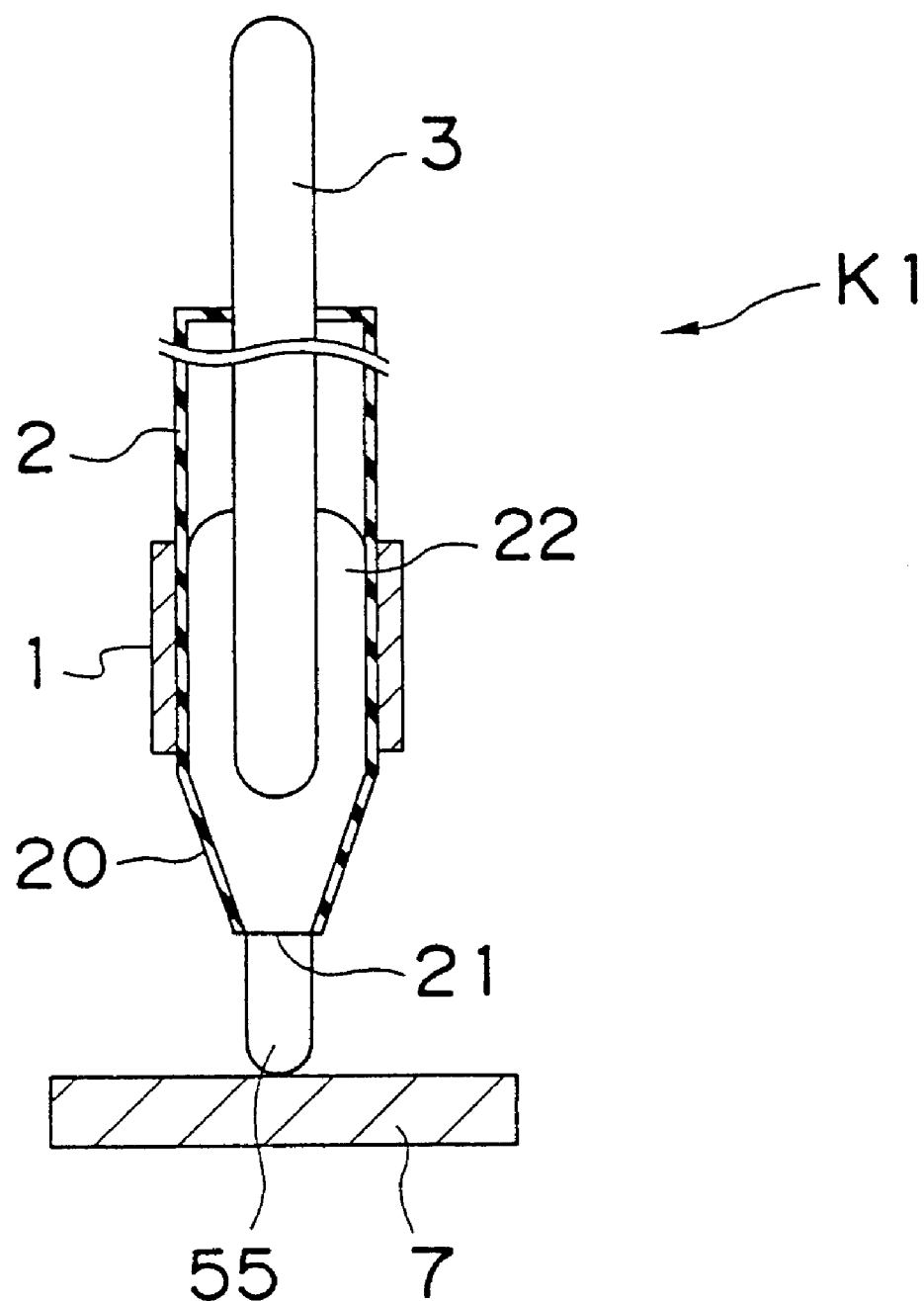
FIG. 2 is an enlarged fragmentary sectional view of the plasma processing apparatus of FIG. 1.

FIG. 1 shows a plasma processing apparatus K1 according to a first embodiment of the present invention and FIG. 2 shows a main portion of the plasma processing apparatus K1 on an enlarged scale. The plasma processing apparatus K1 includes a cylindrical reaction pipe 2, a cylindrical central electrode 3 extending through an upper end of the reaction pipe 2 along an axis of the reaction pipe 2 and a cylindrical metallic outer electrode 1 fitted around an outer periphery of the reaction pipe 2 such that a discharge space 22 is defined between the central electrode 3 and the outer electrode 1 in the reaction pipe 2 as shown by hatching in FIG. 1. Preferably, the distance between the inner surface of the outer electrode 1 and the outer surface of the central electrode 3 ranges from approximately 1 mm to approximately 10 mm.

The reaction pipe 2 is formed cylindrically by electrical insulating material. A converging portion 20 whose diameter gradually decreases downwardly is formed at a lower end portion of the reaction pipe 2 and a blow-off outlet 21 is provided on a lower face of the converging portion 20. A gas inlet pipe 56 is projected from an upper portion of the reaction pipe 2. Dielectric constant of the electrical insulating material for forming the reaction pipe 2 plays a vital role for lowering temperature of the discharge space 22 and is preferably not more than 2,000. If the dielectric constant of the electrical insulating material of the reaction pipe 2 exceeds 2,000, an AC voltage applied between the outer electrode 1 and the central electrode 3 increases but there is a risk that temperature of plasma in the discharge space 22 rises. A lower limit of the dielectric constant of the electrical insulating material of the reaction pipe 2 is not set specifically but may be 2. If the dielectric constant of the electrical insulating material of the reaction pipe 2 is less than 2, the voltage applied between the outer electrode 1 and the central electrode 3 should be increased so as to maintain glow discharge between the outer electrode 1 and the central electrode 3, so that power consumption in the discharge space 22 increases, thereby resulting in rise of temperature of the plasma gas in the discharge space 22.

The electrical insulating material of the reaction pipe 2 includes, for example, vitreous materials such as quartz, alumina and yttria partially stabilized zirconium and ceramic material. Alternatively, the reaction pipe 2 may also be formed by magnesia only or electrical insulating material including magnesia, which leads to stabilization of glow discharge between the outer electrode 1 and the central electrode 3 for the following reason. Namely, magnesia has a high secondary emission factor. Therefore, in case ions in the plasma impinge on an inner surface of the reaction pipe 2, a large quantity of secondary electrons are emitted from the inner surface of the reaction pipe 2 and are accelerated by a sheath formed on the inner surface of the reaction pipe 2 so as to ionize plasma producing gas and thus, glow discharge between the outer electrode 1 and the central electrode 3 is stabilized.

The outer electrode 1 is fitted around the outer periphery of the reaction pipe 2 at a portion of the reaction pipe 2, which abuts on an upper end of the converging portion 20. The metallic material of the outer electrode 1 preferably has high thermal conductivity, so that heat dissipation property of the outer electrode 1 is improved and thus, glow discharge between the outer electrode 1 and the central electrode 3 can be made uniform. For example, the metallic material of the outer electrode 1 includes copper, aluminum, brass and corrosion-resistant stainless steel. The outer electrode 1 can also be formed into a platelike or meshy shape.

When an arithmetic mean of surface roughness of an inner surface of the outer electrode 1 is set at 10 to 1,000 $\mu$m, glow discharge in the discharge space 22 can be made uniform. To this end, the inner surface of the outer electrode 1 should be brought into close contact with an outer surface of the reaction pipe 2 and an outer surface of the central electrode 3 also should be roughened in the same manner as the outer electrode 1. From a microscopic standpoint, this may be because an aggregate of quite minute micro-discharges is formed so as to prevent transition of glow discharge between the outer electrode 1 and the central electrode 3 to arc discharge. If surface roughness of the inner surface of the outer electrode 1 is less than 10 $\mu$m, glow discharge between the outer electrode 1 and the central electrode 3 is less likely to happen. On the other hand, in case surface roughness of the inner surface of the outer electrode 1 exceeds 1,000 $\mu$m, nonuniform glow discharge between the outer electrode 1 and the central electrode 3 may occur. Working such as sandblasting can be employed for roughening the inner surface of the outer electrode 1. Meanwhile, supposing that surface roughness is expressed by an equation (y=f(x)) and "l" denotes a length of an electrode, an arithmetic mean Ra ($\mu$m) of the surface roughness is defined by the following equation (1) in JIS (Japanese Industrial Standards) B 0601.

$$Ra=(1/l)\int_0^l |f(x)|dx \qquad (1)$$

The central electrode 3 is provided in the reaction pipe 2 so as to confront the outer electrode 1 and extends through the upper end of the reaction pipe 2 along the axis of the reaction pipe 2 from the upper end of the converging portion 20. The central electrode 3 is supported in the reaction pipe 2 by a plurality of supports 24. In the reaction pipe 2, a space between the outer electrode 1 and the central electrode 3 is formed as the discharge space 22 so as to surround the central electrode 3. The central electrode 3 is formed by a double pipe constituted by an electrode body pipe 25 and a supply pipe 26 placed in the electrode body pipe 25. The electrode body pipe 25 is formed into a hollow rodlike shape having closed opposite ends and a discharge pipe portion 27 is provided at an upper end portion of the electrode body pipe 25, which projects upwardly from the upper end of the reaction vessel 2. The supply pipe 26 has a diameter smaller than that of the electrode body pipe 25 and has open opposite ends so as to extend through an upper end of the electrode body pipe 25 along an axis of the electrode body pipe 25 from a lower end portion of the electrode body pipe 25. An upper end portion of the supply pipe 26, which projects upwardly from the upper end of the electrode body pipe 25, acts as a supply portion 28. In the central electrode 2, a flow path 29 is formed between the electrode body pipe 25 and the supply pipe 26 so as to be communicated with the discharge pipe portion 27. The electrode body pipe 25 and the supply pipe 26 are preferably made of a metallic material similar to that of the outer electrode 1. It is preferable that an outer surface of the electrode body pipe 25 is roughened in the same manner as the inner surface of the outer electrode 1. Furthermore, in order to induce stable glow discharge in the discharge space 22 under atmospheric pressure, it is preferable that the central electrode 3 is coated with dielectric material. If coating of the dielectric material is performed by chemical vapor deposition (CVD) or physical vapor deposition (PVD) so as to form a dielectric film on the central electrode 3, the dielectric film has a quite structurally fine and smooth surface and poor adsorptivity.

In the plasma processing apparatus K1, refrigerant is used for cooling the central electrode 3. It is preferable that the refrigerant is a liquid having antifreezing property at a temperature of 0° C., electrical insulating property and corrosion resistance. Ion exchange water may also be used as the refrigerant. In order to prevent electrical leak from the electrodes subjected to high voltage, electrical insulating property of the refrigerant preferably has a withstand voltage of not less than 10 kV at an interval of 0.1 mm. For example, perfluorocarbon, hydrofluoroether, etc. can be used as the refrigerant. Meanwhile, a mixed liquid in which 5–10% by weight of ethylene glycol is added to pure water may also be used as the refrigerant.

In the plasma processing apparatus K1, the AC voltage applied between the outer electrode 1 and the central electrode 3 has a frequency of 1 kHz to 50 GHz, preferably a frequency of 10 kHz to 200 MHz. If the frequency of the AC voltage is less than 1 kHz, glow discharge in the discharge space 22 may not be stabilized. On the other hand, if the frequency of the AC voltage exceeds 200 MHz, temperature of the plasma in the discharge space 22 may rise extraordinarily. When the AC voltage is applied between the outer electrode 1 and the central electrode 3, it is preferable that the outer electrode 1 is connected to a power source 17 and the central electrode 3 is grounded for the following reason. Namely, in this case, since potential difference between the central electrode 3 and an article 7 to be processed becomes substantially zero, streamer discharge between the central electrode 3 and the article 7 can be restrained. Especially, in case the article 7 includes metallic portions, streamer discharge between the central electrode 3 and the article 7 is induced quite frequently and thus, the central electrode 3 is preferably grounded. In the plasma processing apparatus K1, the central electrode 3 is grounded at the supply portion 28 of the supply pipe 26.

In the plasma processing apparatus K1, inert gas (rare gas) or a mixed gas of inert gas and reactive gas can be used as the plasma producing gas. Helium, argon, neon, krypton, etc. can be employed as the inert gas. However, from a standpoint of stability of glow discharge and economic aspect, helium or argon is preferably employed as the inert gas. Meanwhile, if only argon is employed as the inert gas, streamer discharge is readily induced between the central electrode 3 and the article 7. Therefore, it is preferable that a mixed gas in which argon is diluted with helium is employed as the inert gas. Mixing ratio of argon and helium in this mixed gas closely depends also on temperature of the discharge space 22 but the mixed gas preferably contains not more than 90% by weight of argon in case the central electrode 3 is set at a temperature of not more than 250° C. If the mixed gas contains more than 90% by weight of argon, streamer discharge is readily induced between the central electrode 3 and the article 7 probably because energy in metastable state and lifetime of argon are smaller than those of helium.

Meanwhile, kinds of the reactive gas can be selected arbitrarily in accordance with purposes of plasma processing. For example, in case cleaning of organic substance existing on a surface of the article 7, separation of a resist and etching of an organic film are performed by plasma processing, oxidizing gas such as oxygen, air, carbon dioxide ($CO_2$) and dinitrogen oxide ($N_2O$) are preferably employed as the reactive gas. In case silicon or the like is etched, fluoric gas such as carbon tetrafluoride ($CF_4$) can be effectively as the reactive gas. Meanwhile, in case metallic oxide is reduced, reducing gas such as hydrogen and ammonia can be employed as the reactive gas and the mixed gas of the inert gas and the reducing gas acting as the reactive gas contains not more than 10% by weight of, preferably 0.1 to 5% by weight of the reducing gas. If the mixed gas contains less than 0.1% by weight of the reducing gas, effects of plasma processing are lessened. On the other hand, if the mixed gas contains more than 10% by weight of the reducing gas, glow discharge may become unstable.

Meanwhile, elimination of organic substance and reduction or elimination of inorganic substance can also be performed by only the inert gas without using the reactive gas, namely without the need for causing oxidization or fluorination on the surface of the article 7. At this time, the plasma attacks the article 7 on the basis of a combination of kinetic energy of ions or radicals of the inert gas existing in the plasma and kinetic energy of the plasma jet so as to overcome binding energy of compound on the surface of the article 7.

Furthermore, impurities contained in air may be adsorbed on an inside of the reaction pipe 2 during stop of operation of the plasma processing apparatus K1. Therefore, in order to remove such impurities adsorbed on the inside of the reaction pipe 2, a heater 110 for heating the reaction pipe 2 is provided in the plasma processing apparatus K1 as shown in FIG. 1.

Hereinafter, a plasma processing method employing the plasma processing apparatus K1 of the above described arrangement is described. Initially, the plasma producing gas is introduced into the reaction pipe 2 from the gas inlet pipe 56 as shown by the arrow A in FIG. 1 and an RF (radio-frequency) AC voltage is applied between the outer electrode 1 and the central electrode 3 by the power source 17. At the same time, the central electrode 3 is cooled by the refrigerant and the outer electrode 1 is subjected to air-cooling by air flow or the like by using a cooling fan 51 including a cooler 51a and a fan 51b as shown in FIG. 1. Then, glow discharge is induced in the discharge space 22 under atmospheric pressure by the AC voltage applied between the outer electrode 1 and the central electrode 3 so as to convert the plasma producing gas in the reaction pipe 2 into plasma state. Thus, since this plasma is blown, as a plasma jet 55, from the blow-off outlet 21 to the surface of the article 7, the surface of the article 7 is subjected to plasma processing.

In the present invention, it is preferable that applied power density ranges from 20 to 10,000 W/cm$^3$, more preferably from 50 to 3,500 W/cm$^3$ and the plasma jet 55 has a flow velocity of 3 to 30 m/sec. It is to be noted here that the term "applied power density" is defined as electric power applied to a unit volume of the discharge space 22. Meanwhile, in the present invention, both the central electrode 3 and the outer electrode 1 are cooled for the following reason. Namely, if only one of the central electrode 3 and the outer electrode 1 is cooled and the other one of the central electrode 3 and the outer electrode 1 is not cooled, glow discharged is induced immediately after start of operation of the plasma but local emission of electrons takes place at the other one of the central electrode 3 and the outer electrode 1 as the other one of the central electrode 3 and the outer electrode 1 is heated. As a result, streamer is readily generated from the outer one of the central electrode 3 and the outer electrode 1. Once the streamer has been generated, glow discharge is no longer induced and thus, it becomes impossible to perform plasma processing of the article 7.

When the central electrode 3 is cooled by the refrigerant, the refrigerant is supplied into the supply pipe 26 from the open upper end of the supply portion 28 as shown by the arrow B in FIG. 1 so as to flow from the open lower end of the supply pipe 26 into the flow path 29 formed between the electrode body pipe 25 and the supply pipe 26 such that the flow path 29 is filled with the refrigerant. In response to rise of temperature of the central electrode 3, the refrigerant filled in the flow path 29 rises in temperature and loses its cooling capacity. The refrigerant whose cooling capacity has dropped as described above is discharged from the flow path 29 through the discharge pipe portion 27 as shown by the arrow C in FIG. 1 and, at the same time, refrigerant having high cooling capacity is newly introduced into the flow path 29 through the supply pipe 26. By circulating the refrigerant through the flow path 29 as described above, the central electrode 3 can be cooled at all times so as to be kept at a desired temperature.

It is preferable that the outer electrode 1 and the central electrode 3 are cooled to have a surface temperature of not more than 250° C. If the surface temperature of the central electrode exceeds 250° C., streamer discharge may be induced in the discharge space 22 and thus, uniform glow discharge may not be induced in the discharge space 22. Meanwhile, a lower limit of the surface temperature of the central electrode 3 is not set specifically but may be a temperature at which the refrigerant does not freeze, for example, 0° C. It is preferable that a temperature control means for controlling temperature of the central electrode 3 to not more than 250° C. The temperature control means is constituted by a temperature sensor such as a thermocouple 81 (FIG. 13) or an infrared radiation thermometer 82 (FIG. 13) and a temperature controller (not shown). The surface temperature of the central electrode 3 is measured by the temperature sensor and the temperature controller controls circulating flow rate and temperature of the refrigerant on the basis of measurement results of the temperature sensor so as to set temperature of the central electrode 3 to not more than 250° C.

In the plasma processing apparatus K1, since the central electrode 3 and the outer electrode 1 are cooled, rise of temperature of the central electrode 3 and the outer electrode 1 can be restrained even if the plasma is produced under atmospheric pressure by the high-frequency AC voltage, so that rise of temperature of the plasma gas can be prevented and thus, thermal damage to the article 7 can be lessened. Meanwhile, since local heating of the discharge space 22 can be prevented by cooling the central electrode 3 and the outer electrode 1, uniform glow discharge is induced and induction of streamer discharge can be prevented, so that damage to the article 7 caused by streamer discharge can be lessened for the following reason. Namely, conventionally, as temperature of the central electrode 3 rises higher, emission of electrons from the central electrode 3 is further promoted, so that local emission of electrons occurs and thus, streamer discharge is induced from a spot of local emission of electrons. On the other hand, in the present invention, since both the central electrode 3 and the outer electrode 1 are cooled, local emission of electrons is restrained.

In the above mentioned first embodiment, the reaction pipe 2 made of inorganic electrical insulating material is disposed so as to be brought into contact with an inner periphery of the outer electrode 1 such that the discharge space 22 is defined between the central electrode 3 and the reaction pipe 2. However, alternatively, the reaction pipe 2 may also be disposed so as to be brought into contact with an outer periphery of the central electrode 3 such that the discharge space 22 is defined between the outer electrode 1 and the reaction pipe 2. In addition, the discharge space 22 may also be defined both between the inner periphery of the outer electrode 1 and the reaction pipe 2 and between the outer periphery of the central electrode 3 and the reaction pipe 2. Therefore, since the reaction pipe 2 made of electrical insulating material is disposed so as to be brought into contact with the inner periphery of the outer electrode 1 or the outer periphery of the central electrode 3, the reaction pipe 2 acts as a barrier layer which is made of electrical insulating material and disposed between the outer electrode 1 and the central electrode 3, so that glow discharge can be stabilized more positively.

Meanwhile, since the plasma jet 55 is blown from the blow-off outlet 21 so as to concentrate its energy at a small region of the article 7, processing effects and processing speed be improved greatly. Meanwhile, since the cooling means for cooling the central electrode 3 and the outer electrode 1 is provided, voltage applied between the outer electrode 1 and the central electrode 3 can be increased without incurring rise of temperature of the central electrode 3 and the outer electrode 1, so that density of plasma can be increased and thus, processing speed can be raised. Furthermore, since an area on which processing effects are exercised can be restricted to vicinity of the blow-off outlet 21, only a necessary portion of the article 7 can be subjected to plasma processing. Since plasma processing is performed under atmospheric pressure, plasma processing can be performed continuously by transporting the article 7.

Figure 3:
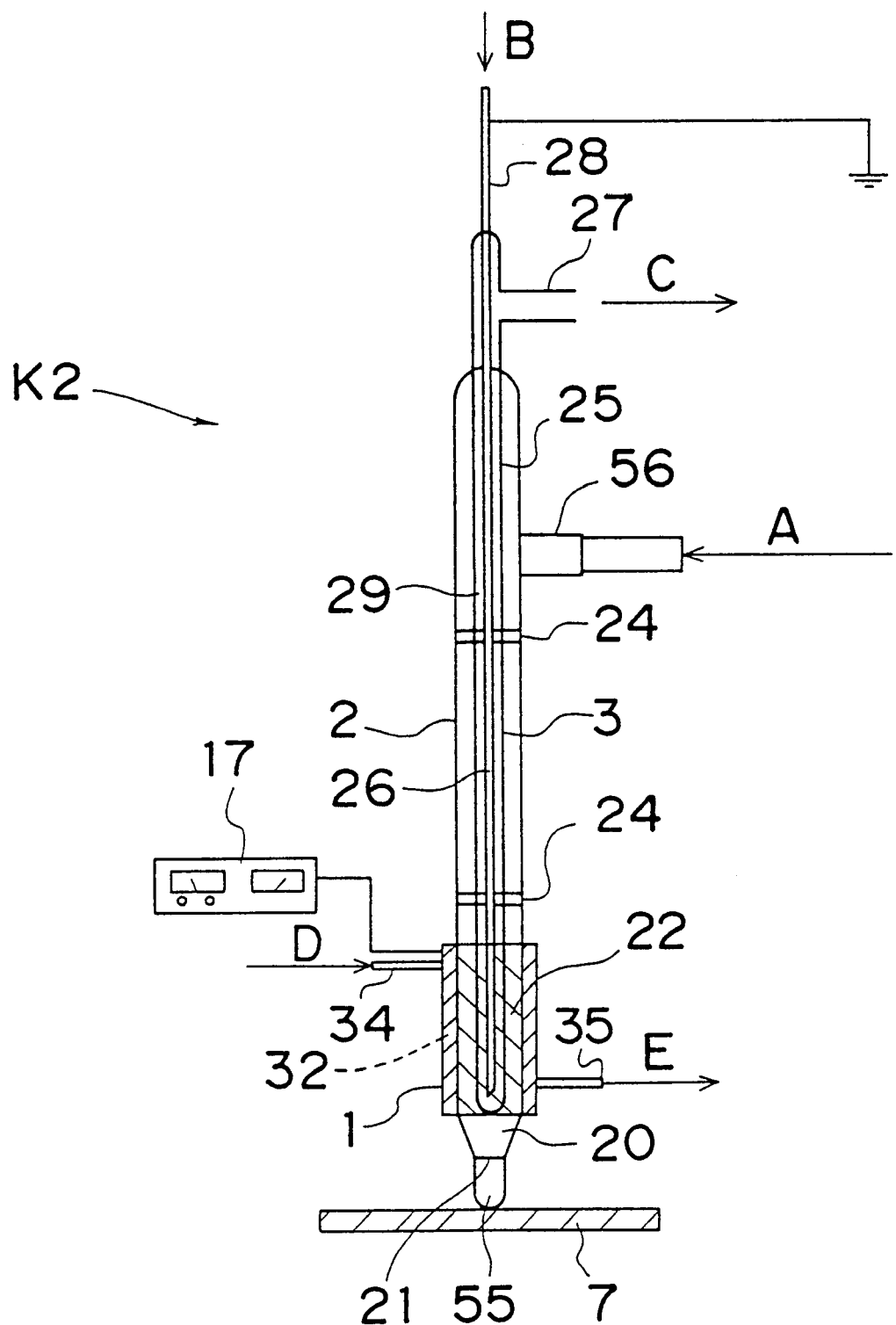
FIG. 3 is a sectional view of a plasma processing apparatus according to a second embodiment of the present invention.
Figure 4:
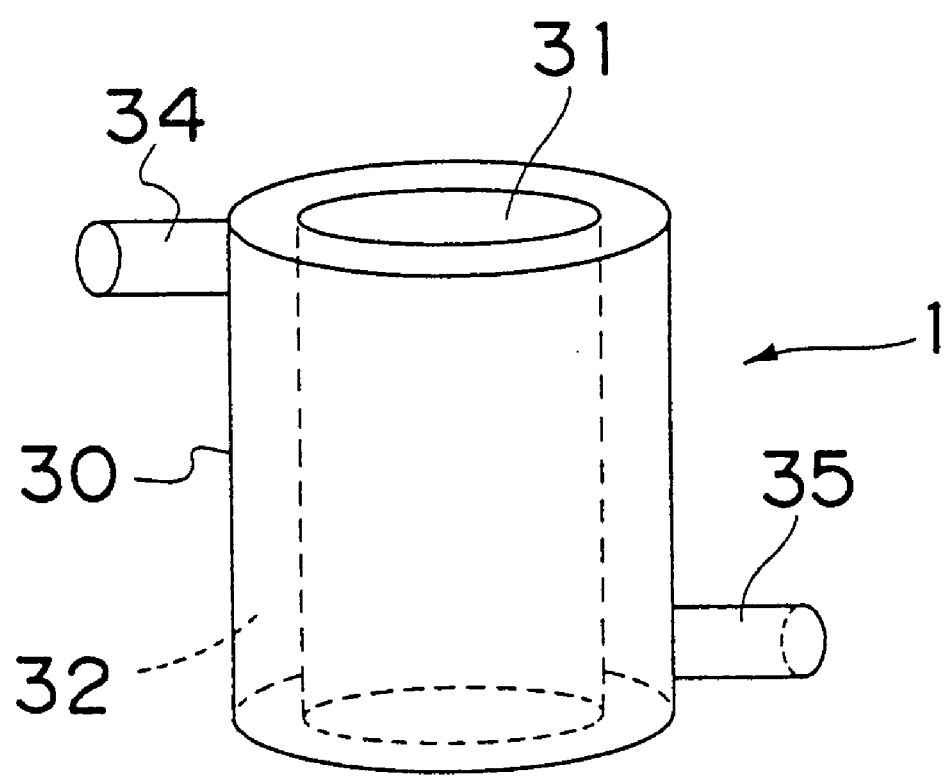
FIG. 4 is an enlarged perspective view of an outer electrode employed in the plasma processing apparatus of FIG. 3.

FIG. 3 shows a plasma processing apparatus K2 according to a second embodiment of the present invention. In the plasma processing apparatus K2, the outer electrode 1 of the plasma processing apparatus K1 of FIG. 1 is replaced by the outer electrode 1 of FIG. 4. In FIG. 4, the outer electrode 1 is made of metal and includes a tubular outer wall 30 and a tubular inner wall 31. Upper and lower ends of the outer wall 30 and the inner wall 31 are closed such that a closed passage 32 is formed between the outer wall 30 and the inner wall 31. An inflow pipe 34 communicating with the passage 32 is provided at an upper portion of an outer face of the outer wall 30, while an outflow pipe 35 communicating with the passage 32 is provided at a lower portion of the outer face of the outer wall 30 so as to be circumferentially opposite to the inflow pipe 34. Meanwhile, an inner peripheral surface of the inner wall 31 is roughened by sandblasting or the like and has a surface roughness of 10 to 1,000 $\mu$m. By fitting the outer electrode 1 around the reaction pipe 2 such that the inner peripheral surface of the inner wall 31 is brought into contact with an outer periphery of the reaction pipe 2, the plasma processing apparatus K2 is obtained. Since other constructions of the plasma processing apparatus K2 are similar to those of the plasma processing apparatus K1, the description is abbreviated for the sake of brevity.

When plasma processing is performed by using the plasma processing apparatus K2, not only the central electrode 3 is cooled by the refrigerant in the same manner as the plasma processing apparatus K1 but the outer electrode 1 is also cooled by the refrigerant. Namely, the refrigerant is supplied to the passage 32 from the inflow pipe 34 as shown by the arrow D in FIG. 3 so as to fill the outer electrode 1 such that the outer electrode 1 is cooled by the refrigerant. Therefore, in plasma processing of the plasma processing apparatus K2, the plasma producing gas is initially introduced into the reaction pipe 2 from the gas inlet pipe 56 as shown by the arrow A in FIG. 3 and the RF AC voltage is applied between the outer electrode 1 and the central electrode 3 by the power source 17. At the same time, the outer electrode 1 and the central electrode 3 are cooled by the refrigerant. Since the subsequent procedures of plasma processing of the plasma processing apparatus K2 are similar to those of the plasma processing apparatus K1, the description is abbreviated for the sake of brevity. Temperature of the refrigerant filled in the passage 32 rises in response to rise of temperature of the outer electrode 1 and thus, cooling capacity of the refrigerant drops. The refrigerant whose cooling capacity has dropped as described is discharged from the passage 32 through the outflow pipe 35 as shown by the arrow E in FIG. 3. At the same time, refrigerant having high cooling capacity is newly introduced into the passage 32 from the inflow pipe 32. By circulating the refrigerant through the passage 32 as described above, the outer electrode 1 can be cooled at all times so as to be kept at a desired temperature. It is preferable that the outer electrode 1 is cooled so as to have a surface temperature of not more than 250° C. In the same manner as the plasma processing apparatus K1, it is preferable that a temperature control means constituted by the temperature sensor 81 or 82 (FIG. 13) and a temperature controller (not shown) is used for cooling the outer electrode 1 to a temperature of not more than 250° C.

In the second embodiment, since both the outer electrode 1 and the central electrode 3 are cooled by the refrigerant, rise of temperature of the outer electrode 1 and the central electrode 3 can be restrained even if plasma is induced under atmospheric pressure by a high-frequency AC voltage, so that further rise of temperature of plasma gas can be prevented and thus, thermal damage to the article 7 can be lessened. Meanwhile, since local heating in the discharge space 22 can be prevented more positively by cooling both the outer electrode 1 and the central electrode 3, more uniform glow discharge is induced and induction of streamer discharge can be restrained, so that damage to the article 7 caused by streamer discharge can be lessened further. This may be because local emission of electrons from the outer electrode 1 and the central electrode 3 is restricted by cooling both the outer electrode 1 and the central electrode 3. If both the central electrode 3 and the outer electrode 1 are cooled by a single cooling system, the central electrode 3 and the outer electrode 1 should be electrically insulated from each other. To this end, a line for conveying the refrigerant to the central electrode 3 and the outer electrode 1 should be formed by electrical insulating material. Furthermore, in order to prevent electrical conduction between the central electrode 3 and the outer electrode 1 through the refrigerant, a line section connecting an inlet port of the refrigerant for one of the central electrode 3 and the outer electrode 1 and an outlet port for the refrigerant for the other one of the central electrode 3 and the outer electrode 1 should have a predetermined length.

Figure 5:
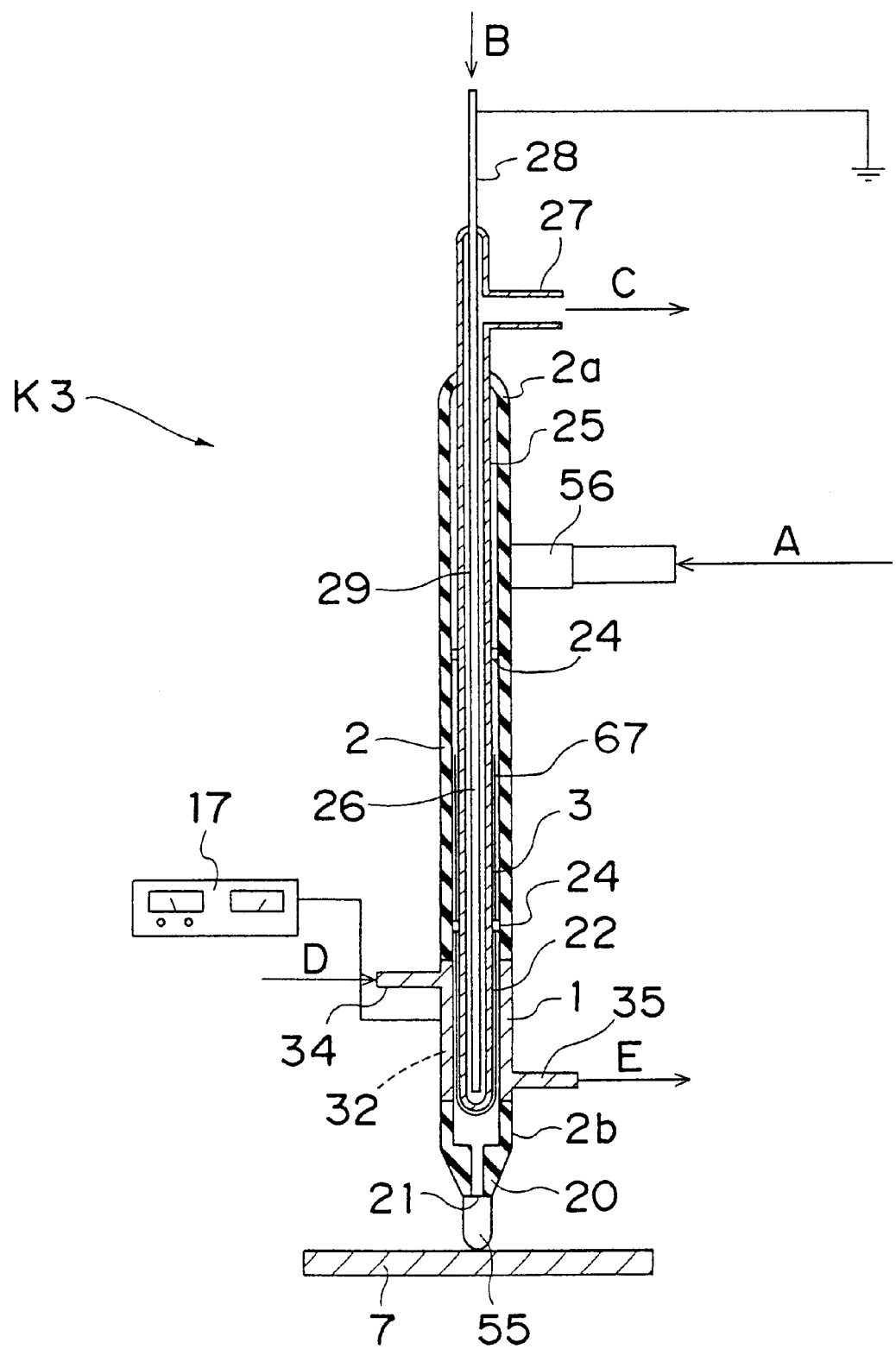
FIG. 5 is a sectional view of a plasma processing apparatus according to a third embodiment of the present invention.

FIG. 5 shows a plasma processing apparatus K3 according to a third embodiment of the present invention. In the plasma processing apparatus K3, the outer electrode 1 shown in FIG. 4 is formed integrally with the reaction pipe 2 without being fitted around the reaction pipe 2 as shown in FIG. 3. Namely, in the plasma processing apparatus K3, the reaction pipe 2 made of electrical insulating material is formed by an upper portion 2a and a lower portion 2b. When an upper end of the outer electrode 1 and a lower end of the upper portion 2a are joined with each other and a lower end of the outer electrode 1 and an upper end of the lower portion 2b are joined with each other, the reaction pipe 2 and the outer electrode 1 are formed integrally with each other such that the outer electrode 1 is disposed between the outer portion 2a and the lower portion 2b. Since other constructions of the plasma processing apparatus K3 are similar to those of the plasma processing apparatus K2, the description is abbreviated for the sake of brevity.

Therefore, in the plasma processing apparatus K3, the outer electrode 1 and the central electrode 3 confront each other directly without the electrical insulating member therebetween but the outer electrode 1 and the central electrode 3 are electrically insulated from each other by the upper portion 2a of the reaction pipe 2.

Figure 6:
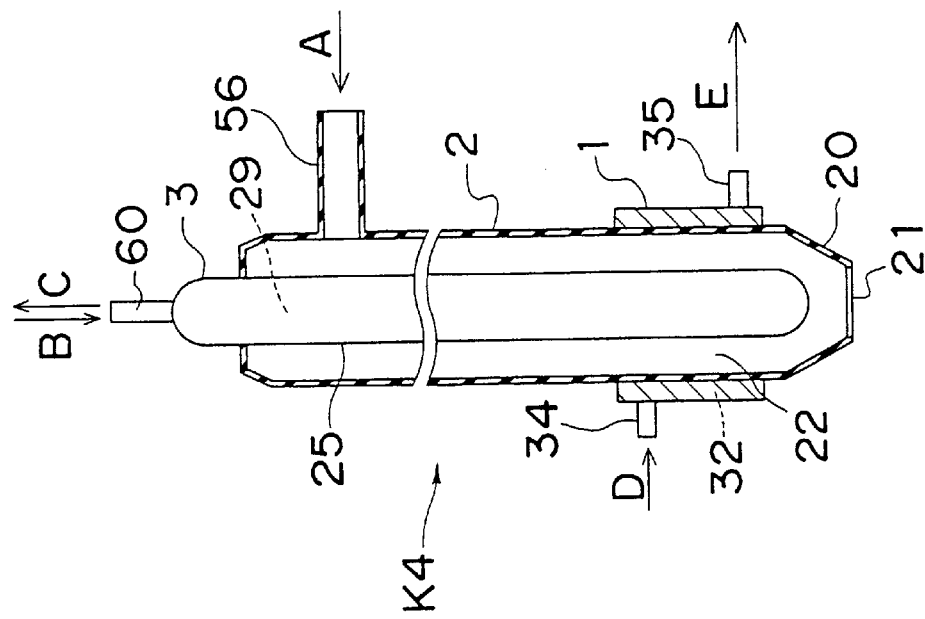
FIG. 6 is a side elevational view of a plasma processing apparatus according to a fourth embodiment of the present invention.
Figure 7:
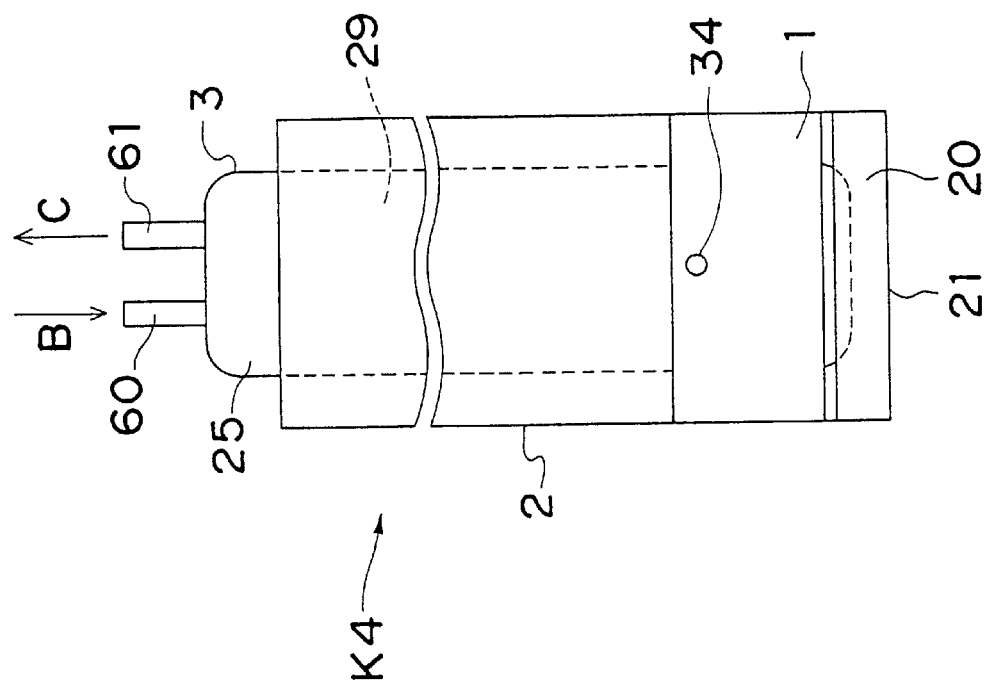
FIG. 7 is a sectional view of the plasma processing apparatus of FIG. 6.

FIGS. 6 and 7 show a plasma processing apparatus K4 according to a fourth embodiment of the present invention. In the plasma processing apparatus K4, the reaction pipe 2 is formed into a shape of a rectangular parallelepiped having a rectangular cross section. Hence, the converging portion 20 whose width gradually decreases downwardly is formed at the lower end portion of the reaction pipe 2 and the blow-off outlet 21 is provided on a substantially whole lower face of the converging portion 20. Meanwhile, the metallic outer electrode 1 is fitted around a whole outer periphery of the reaction pipe 2 so as to have a rectangular cross section corresponding to that of the reaction pipe 2. The central electrode 3 is constituted by a hollow electrode body pipe 25 having a rectangular cross section corresponding to that of the reaction pipe 2, a supply pipe portion 60 projecting from an upper end of the electrode body pipe 25 and a discharge pipe portion 61 projecting from the upper end of the electrode body pipe 25. The flow path 29 is formed in the electrode body pipe 25 so as to be communicated with the supply pipe portion 60 and the discharge pipe portion 61. It is preferable that the central electrode 3 is made of a metallic material similar to that of outer electrode 1 and the outer surface of the electrode body pipe 25 is roughened in the same manner as the inner surface of the outer electrode 1. Since other constructions of the plasma processing apparatus K4 are similar to those of the plasma processing apparatus K2, the description is abbreviated for the sake of brevity.

When plasma processing is performed by the plasma processing apparatus K4 of the above described arrangement, both the outer electrode 1 and the central electrode 3 are cooled by the refrigerant in the same manner as the plasma processing apparatus K2. When the central electrode 3 is cooled by the refrigerant, the refrigerant is supplied to the flow path 29 of the electrode body pipe 25 from the supply pipe portion 60 as shown by the arrow B in FIG. 6 so as to fill the flow path 29. Temperature of the refrigerant filled in the flow path 29 rises in response to rise of temperature of the central electrode 3. The refrigerant whose cooling capacity has dropped as described above is discharged from the flow path 29 through the discharge pipe portion 61 as shown by the arrow C in FIG. 6. At the same time, refrigerant having high cooling capacity is newly introduced into the flow path 29. By circulating the refrigerant through the flow path 29 as described above, the central electrode 3 can be cooled by the refrigerant at all times so as to be kept at a desired temperature. Meanwhile, the outer electrode 1 is cooled by the refrigerant in the same manner as the plasma processing apparatus K2.

Meanwhile, in the plasma processing apparatuses K1 to K4, the reaction pipe 2 is tapered as the converging portion 20 so as to decrease in diameter towards the blow-off outlet 21. However, this arrangement may be replaced by an arrangement shown in FIGS. 8 and 9 in which a bottom wall 64 for closing the discharge space 22 is provided at a distal end of the reaction pipe 2 and a plurality of, for example, four pores 65 acting as the blow-off outlet 21 are formed on the bottom wall 64. Since the discharge space 22 is brought closer to the blow-off outlet 21 than the converging portion 20 when the arrangement of FIGS. 8 and 9 is employed, plasma can be blown to the article 7 before active species such as radicals and ions in plasma are extinguished, so that processing effects are enhanced greatly.

Figure 8:
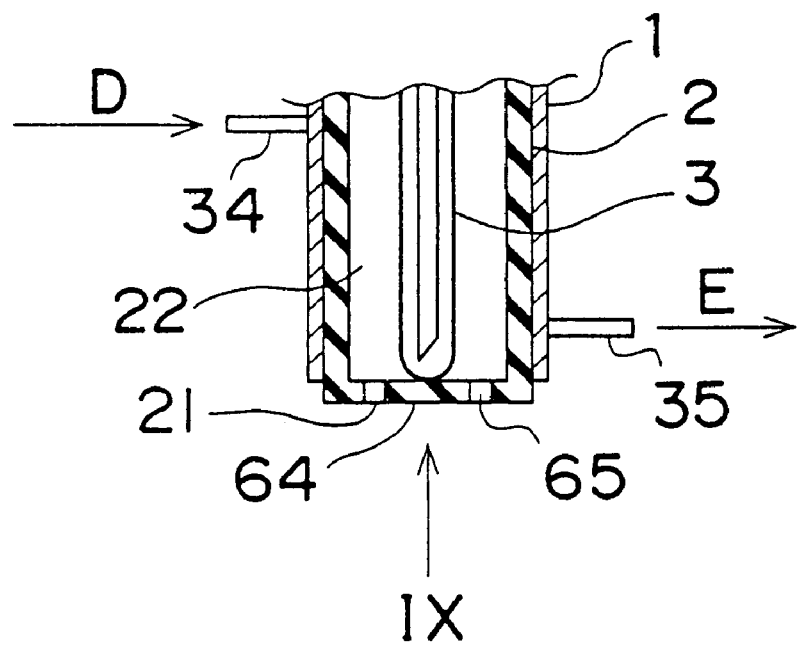
FIG. 8 is a fragmentary sectional view of a modified plasma processing apparatus of the present invention.
Figure 9:
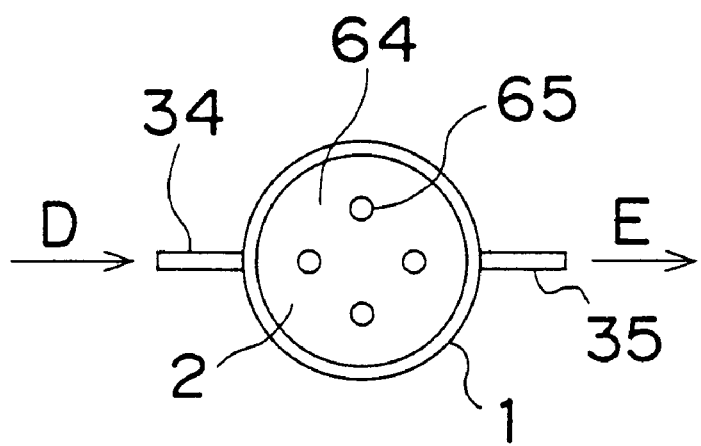
FIG. 9 is a view of the modified plasma processing apparatus of FIG. 8 as observed in the direction of the arrow IX in FIG. 8.

FIGS. 10 and 11 show an example in which the arrangement of FIGS. 8 and 9 is employed in the plasma processing apparatus K4 of FIGS. 6 and 7. In FIGS. 10 and 11, a plurality of the pores 65 are formed on the bottom wall 64 of the rectangular reaction pipe 2 and a straightening vane 101 is provided at an upper portion in the reaction pipe 2. Thus, the plasma producing gas is introduced into the reaction pipe 2 from a top of the reaction pipe 2 so as to be passed through the straightening vane 101 such that the plasma jet 55 is blown from the pores 65 to the article 7.

Figure 12:
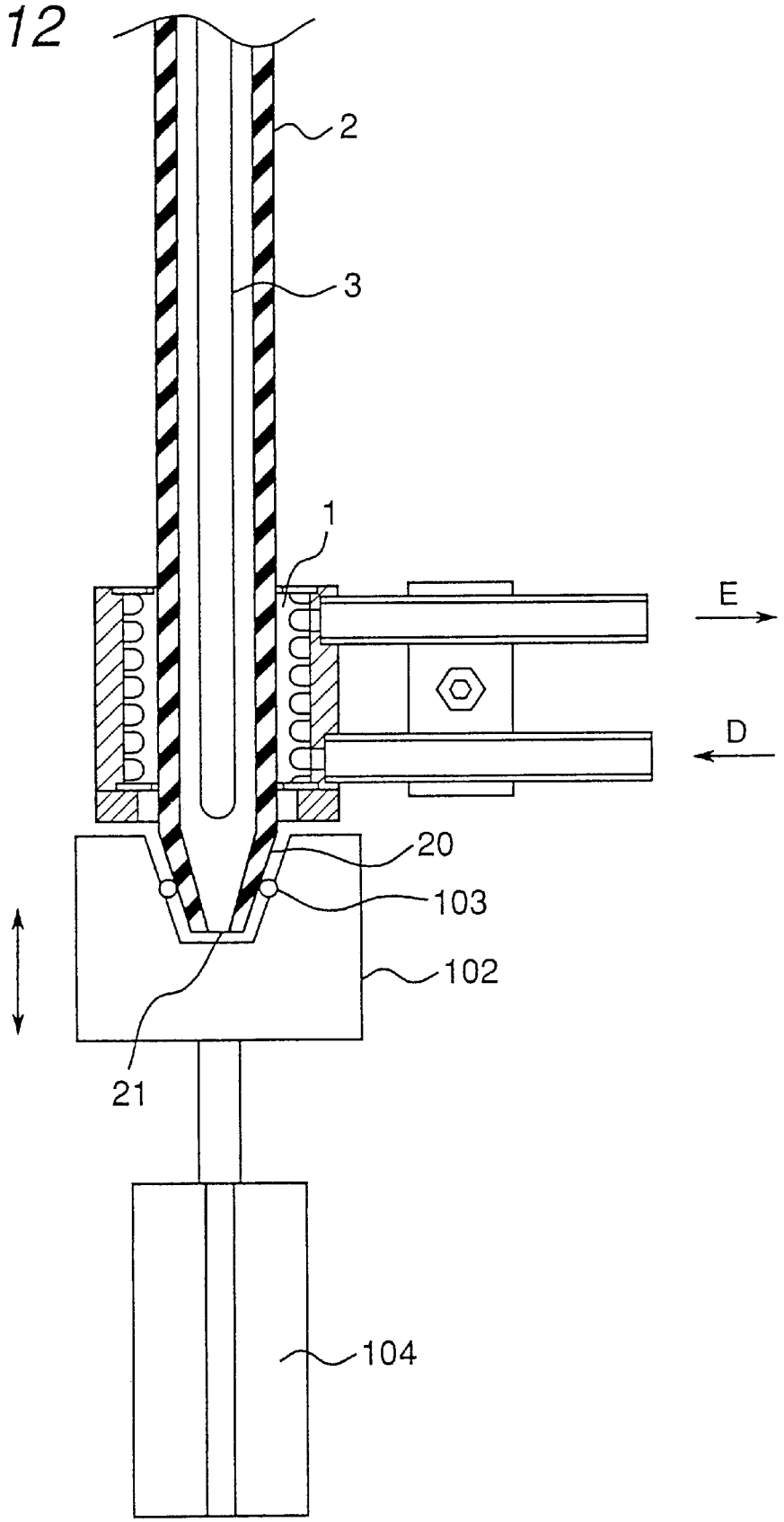
FIG. 12 is a partly sectional fragmentary front elevational view of a still further modified plasma processing apparatus of the present invention.

Furthermore, at the time of stop of induction of glow discharge in the reaction pipe 2 of the plasma processing apparatuses K1 to K4, feed of the reactive gas into the reaction pipe 2 is also stopped and thus, external air penetrates into the reaction pipe 2. As a result, minute quantities of organic substance and moisture in external air are absorbed on an inner periphery of the reaction pipe 2 and an outer periphery of the central electrode 3 and are described therefrom by glow discharge at the time of restart of operation of the plasma processing apparatuses K1 to K4 so as to kill radicals in plasma, which contribute to reaction such that production of the radicals is adversely affected. Therefore, in order to prevent external air from adversely affecting production of the radicals in plasma, it is preferable that the reaction pipe 2 is provided with an air sealing mechanism for preventing entry of external air into the reaction pipe 2 at the time of stop of induction of glow discharge in the reaction pipe 2 as shown in FIG. 12. The air sealing mechanism of FIG. 12 includes a cap 102 mounted on the distal end of the reaction pipe 2 via an O-ring 103 and a cylinder 104 for pressing the cap 102 against the distal end of the reaction pipe 2 through the O-ring 103. In place of the air sealing mechanism referred to above, dried air may be circulated through the reaction pipe 2 so as to prevent entry of external air into the reaction pipe 2.

Figure 13:
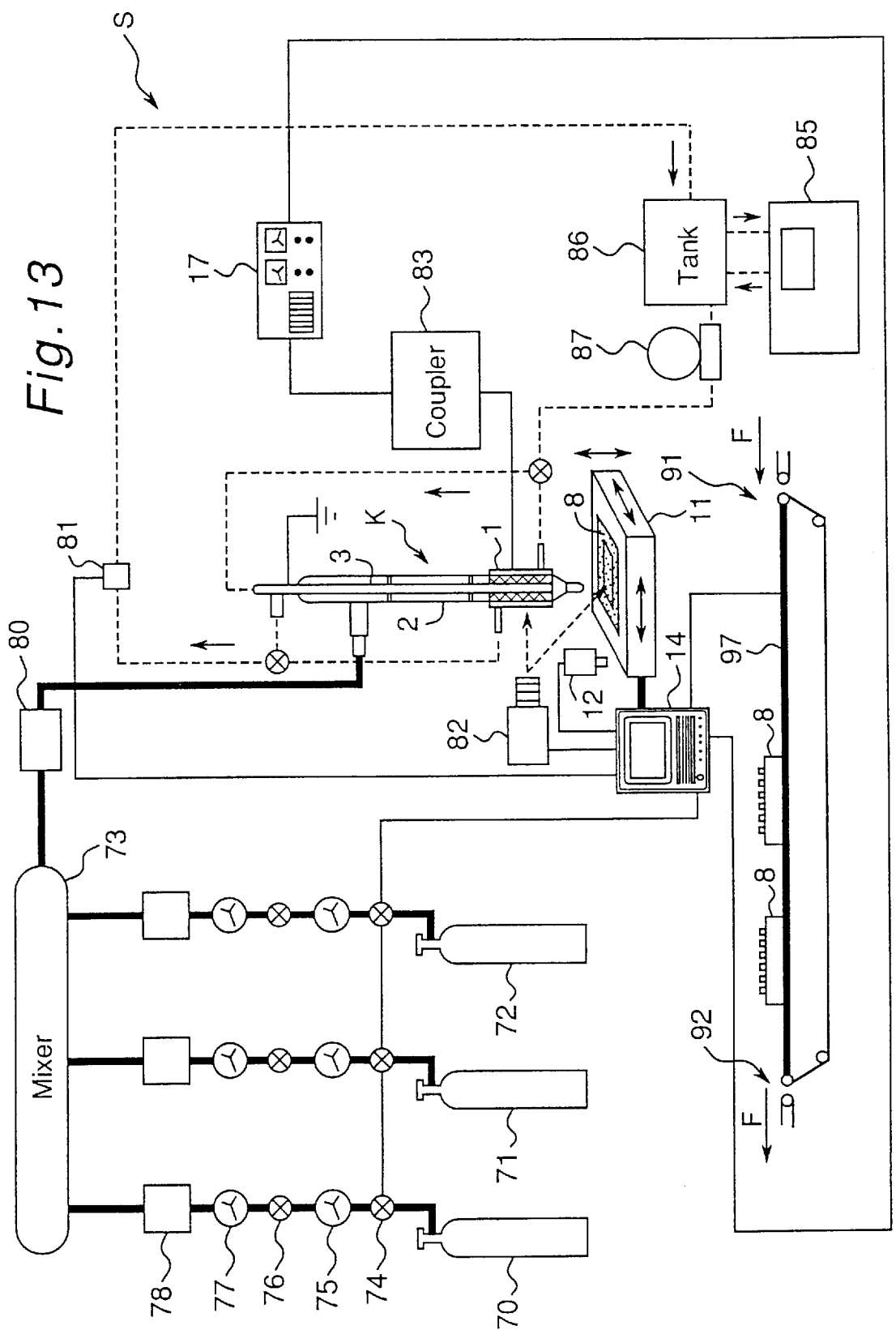
FIG. 13 is a diagram showing a configuration of an automatic plasma processing system according to the present invention, which employs the plasma processing apparatus of the present invention.
Figure 20:
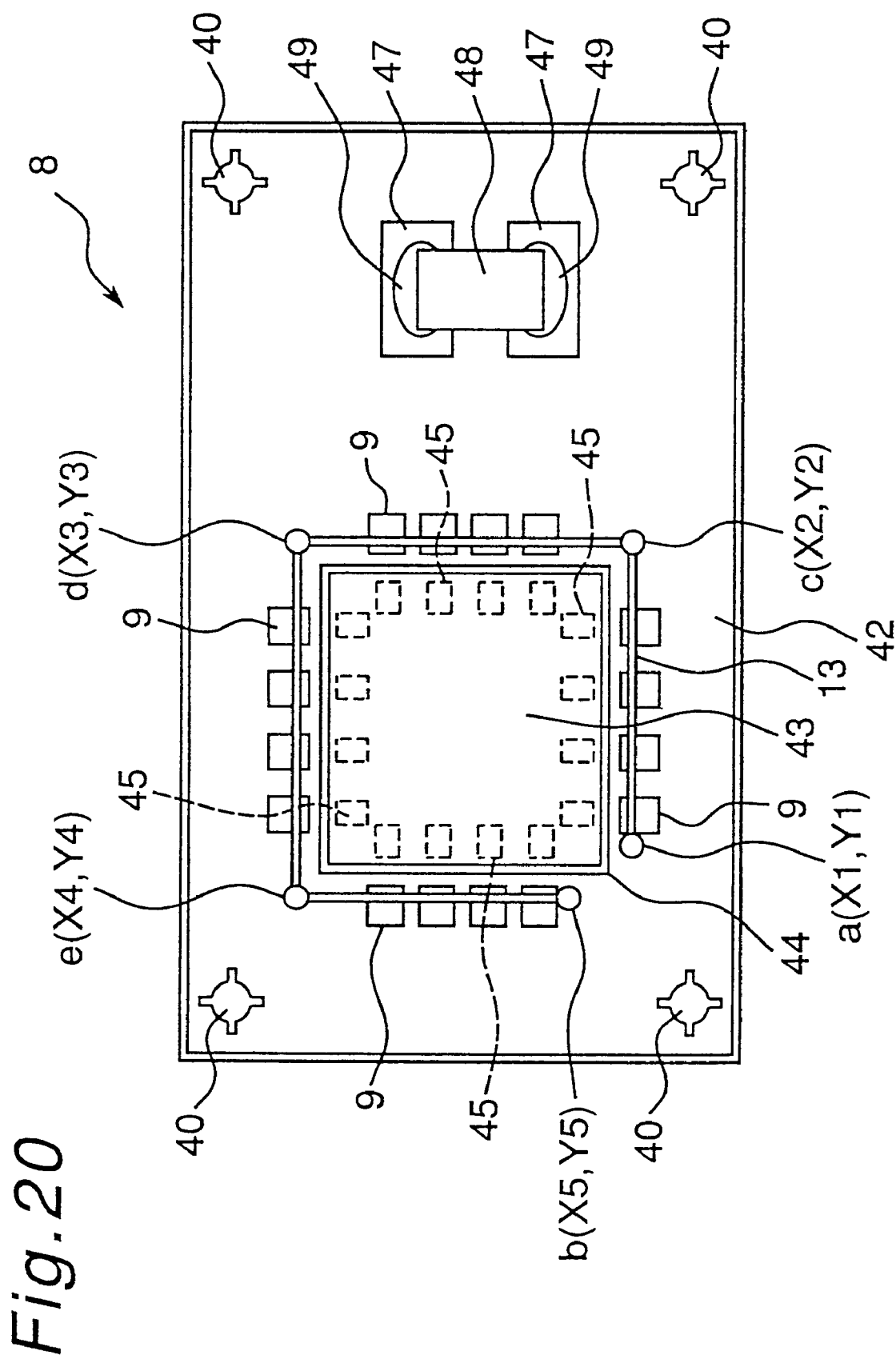
FIG. 20 is a top plan view of a circuit board to be processed by the automatic plasma processing system of FIG. 13.

FIG. 13 shows an automatic plasma processing system S according to the present invention for automatically performing plasma processing of the article 7, for example, a circuit board 8 having IC chips mounted thereon as shown in FIG. 20. Any one of the plasma processing apparatuses K1 to K4 may be employed in the automatic plasma processing system S and is referred to as the "plasma processing apparatus K" as shown in FIG. 13. The automatic plasma processing system S includes an X-Y table 11 for transporting the circuit board 8 not only horizontally in two orthogonal directions of an X-axis and a Y-axis but vertically in a direction of a Z-axis, a conveyor 97 for sequentially carrying a number of the circuit boards 8 from a loading portion 91, via the X-Y table 11, to an unloading portion 92, a detector 12 for detecting a horizontal position of the article and a computer 14 which is electrically connected to the plasma processing apparatus K, the X-Y table 11, the conveyor 97 and the detector 12. The detector 12 is formed by, for example, a camera, while the computer 14 is formed by, for example, a microcomputer or a personal computer.

The automatic plasma processing system S further includes a bomb 70 for containing helium, a bomb 71 for containing argon, a bomb 72 for containing reactive gas such as oxygen, hydrogen and carbon tetrafluoride ($CF_4$), a mixer 73 connected with the bombs 70 to 72, a refrigerator 85, a tank 86 for storing the refrigerant, a pump 87 for feeding the refrigerant to the outer electrode 1 and the central electrode 3, a thermocouple 81 for monitoring temperature of the refrigerant and an infrared radiation thermometer 82 for monitoring temperatures of the outer electrode 1 and the central electrode 3. Each of the bombs 70 to 72 is connected with the mixer 73 through a valve 74, a primary pressure gauge 75, a valve 76, a secondary pressure gauge 77 and a mass flow controller 78. Meanwhile, the mixer 73 is, in turn, connected with the reaction pipe 2 via a back fire preventing valve 80, while the power source 17 is connected to the outer electrode 1 by way of an automatic tuning coupler 83.

Figure 14:
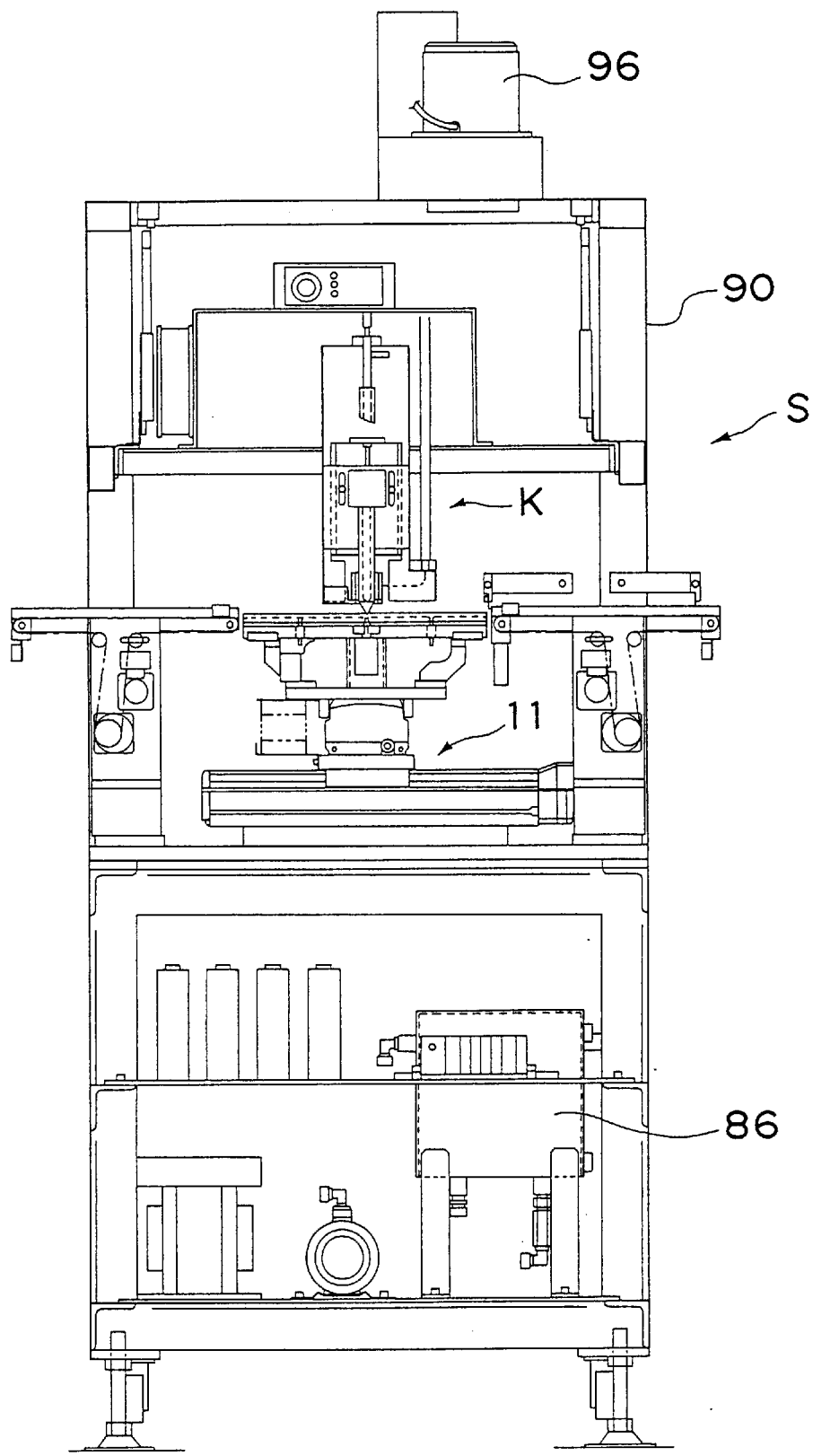
FIG. 14 is a front elevational view showing one example of a main portion of the automatic plasma processing system of FIG. 13.
Figure 15:
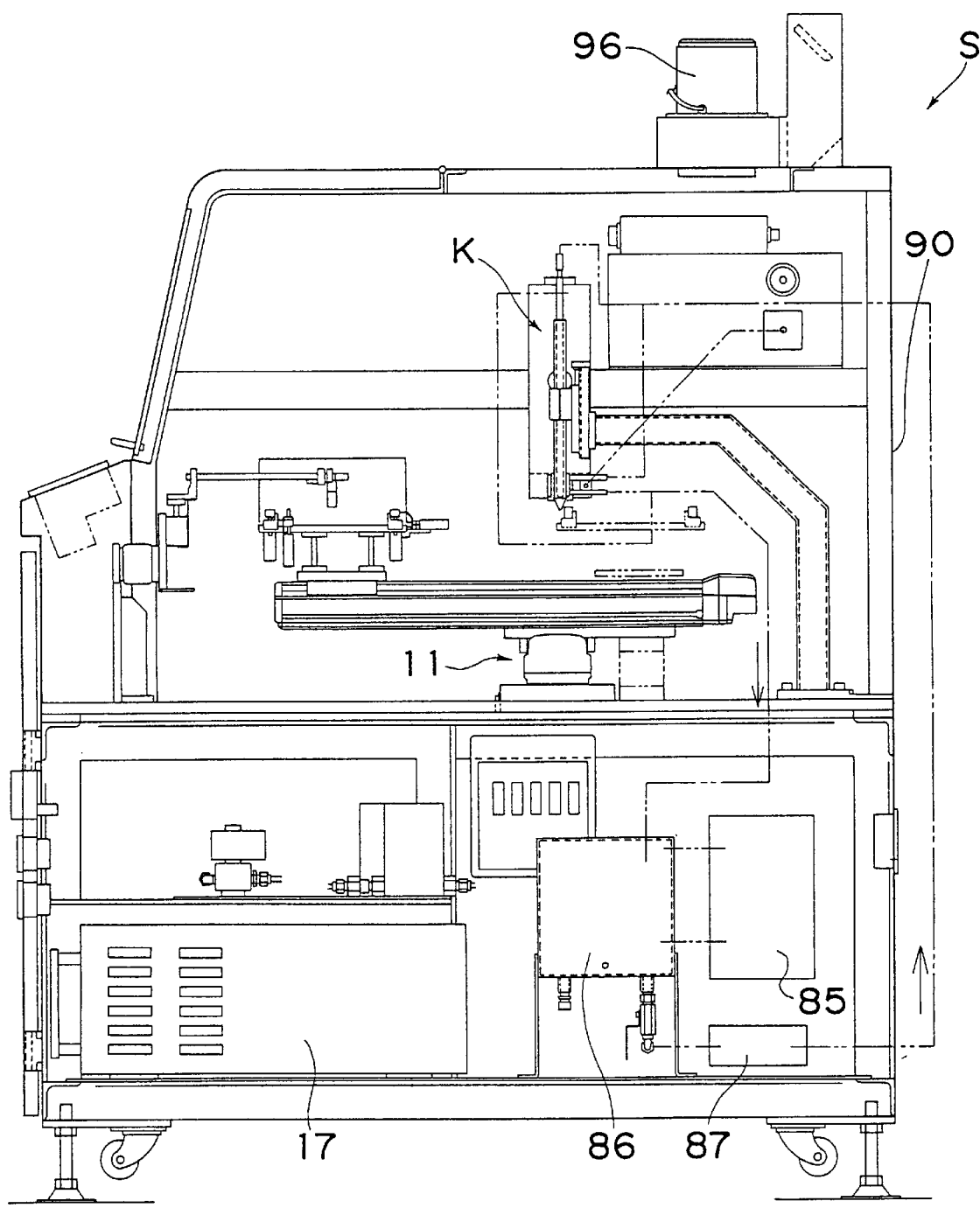
FIG. 15 is a cutaway side elevational view of the main portion of the automatic plasma processing system of FIG. 14.
Figure 16:
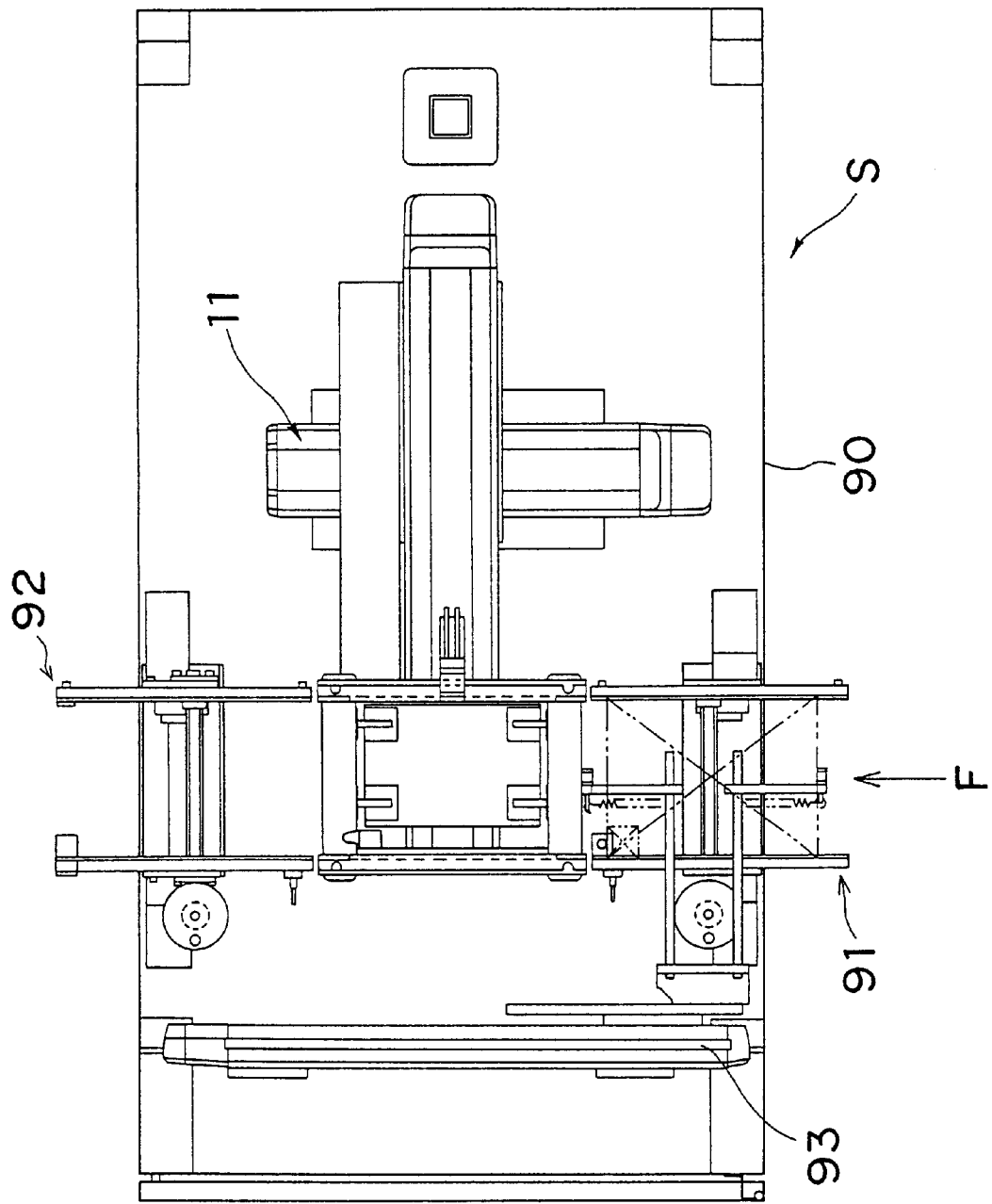
FIG. 16 is a top plan view of the main portion of the automatic plasma processing system of FIG. 14.
Figure 17:
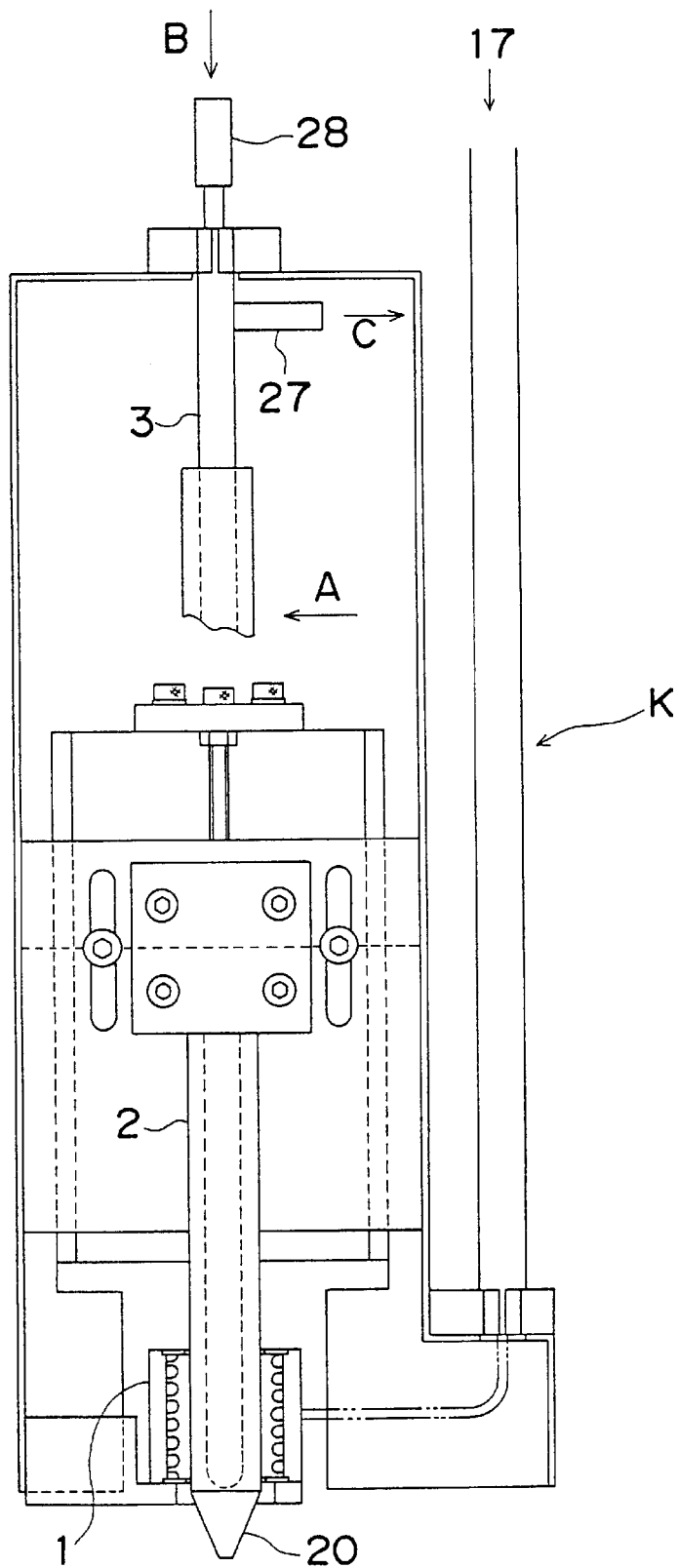
FIG. 17 is an enlarged fragmentary front elevational view of the plasma processing apparatus employed in the automatic plasma processing system of FIG. 14.
Figure 18:
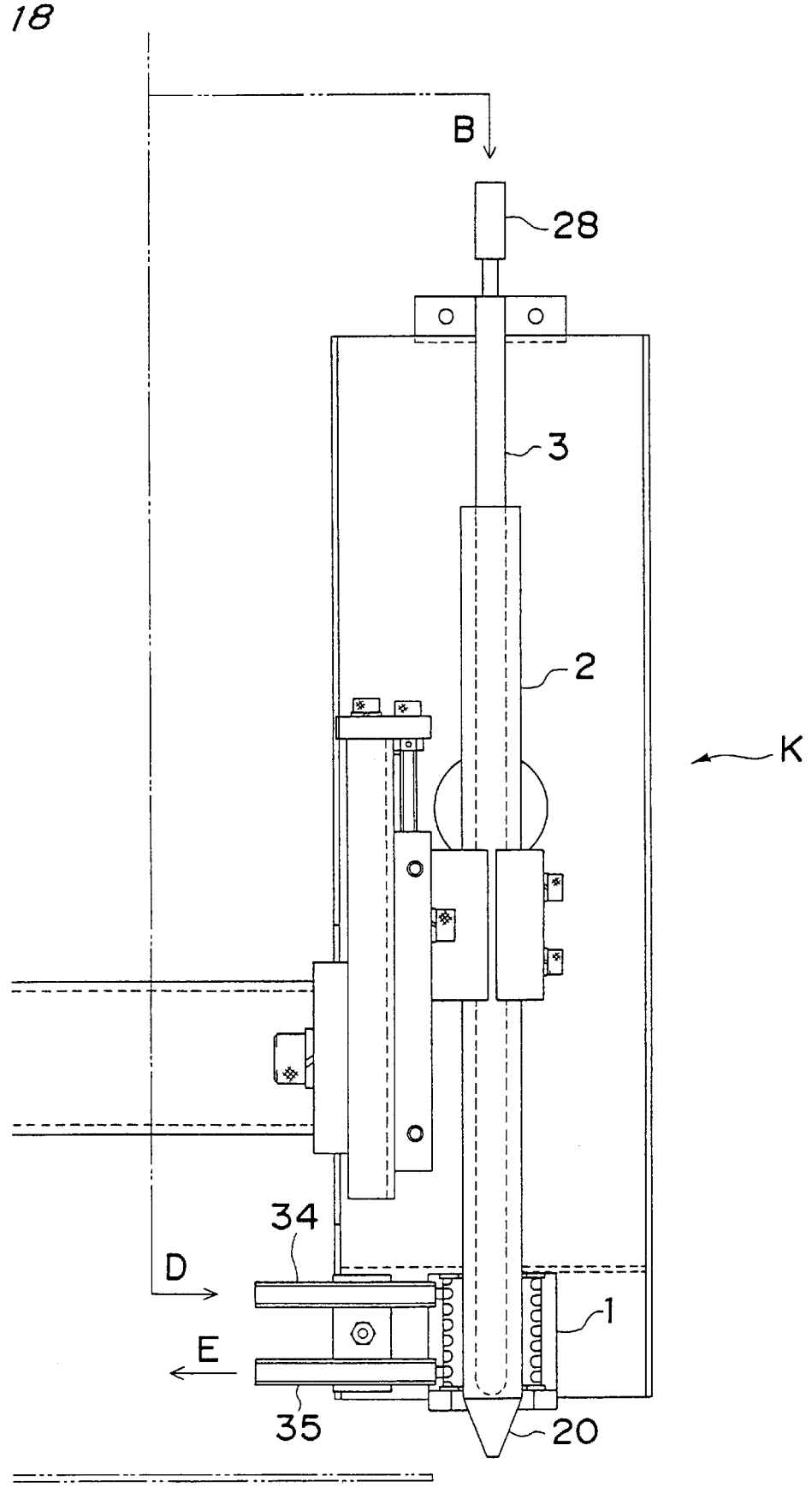
FIG. 18 is an enlarged fragmentary side elevational view of the plasma processing apparatus of FIG. 17.

FIGS. 14 to 16 show one example of a main portion of the automatic plasma processing system S and FIGS. 17 and 18 show a portion of the plasma processing apparatus K employed in the automatic plasma processing system of FIGS. 14 to 16. As best shown in FIG. 16, the automatic plasma processing system S includes a frame 90 having the loading portion 91 and the unloading portion 92, a transfer unit 93 for transferring the circuit board 8 in the direction of the arrow F from the loading portion 91 to the X-Y table 11 and then, from the X-Y table 11 to the unloading portion 92. As shown in FIGS. 14 and 15, the automatic plasma processing system S further includes an exhaust fan 96.

Operation of the automatic plasma processing system S of the above described arrangement is described briefly. Helium, argon and the reactive gas are carried to the mixer 73 from the bombs 70 to 72 at predetermined flow rates by the mass flow controllers 78, respectively so as to be mixed by the mixer 73 and the gas mixture is drawn, as the plasma producing gas, into the reaction pipe 2. The refrigerant cooled by the refrigerator 85 is circulated through the central electrode 3 and the outer electrode 1 from the tank 86 by the pump 87. Meanwhile, the AC voltage is applied to the outer electrode 1 by the power source 17, while the central electrode 3 is grounded. Thus, plasma is induced in the discharge space 22 under atmospheric pressure such that the circuit board 8 placed on the X-Y table 11 is subjected to plasma processing by the plasma processing apparatus K. The circuit board 8 is displaced by the X-Y table 11 in response to a command from the computer 14 such that a predetermined portion of the circuit board 8 is subjected to plasma processing by the plasma processing apparatus K. If the computer 14 detects that temperatures of the outer electrode 1 and the central electrode 3 measured by the infrared radiation thermometer 82 or temperature of the refrigerant measured by the thermocouple 81 is abnormal, the computer 14 closes the valves 74 so as to stop supply of the plasma producing gas to the reaction pipe 2 and turns off the power source 17 so as to stop supply of electric power to the outer electrode 1.

Figure 19:
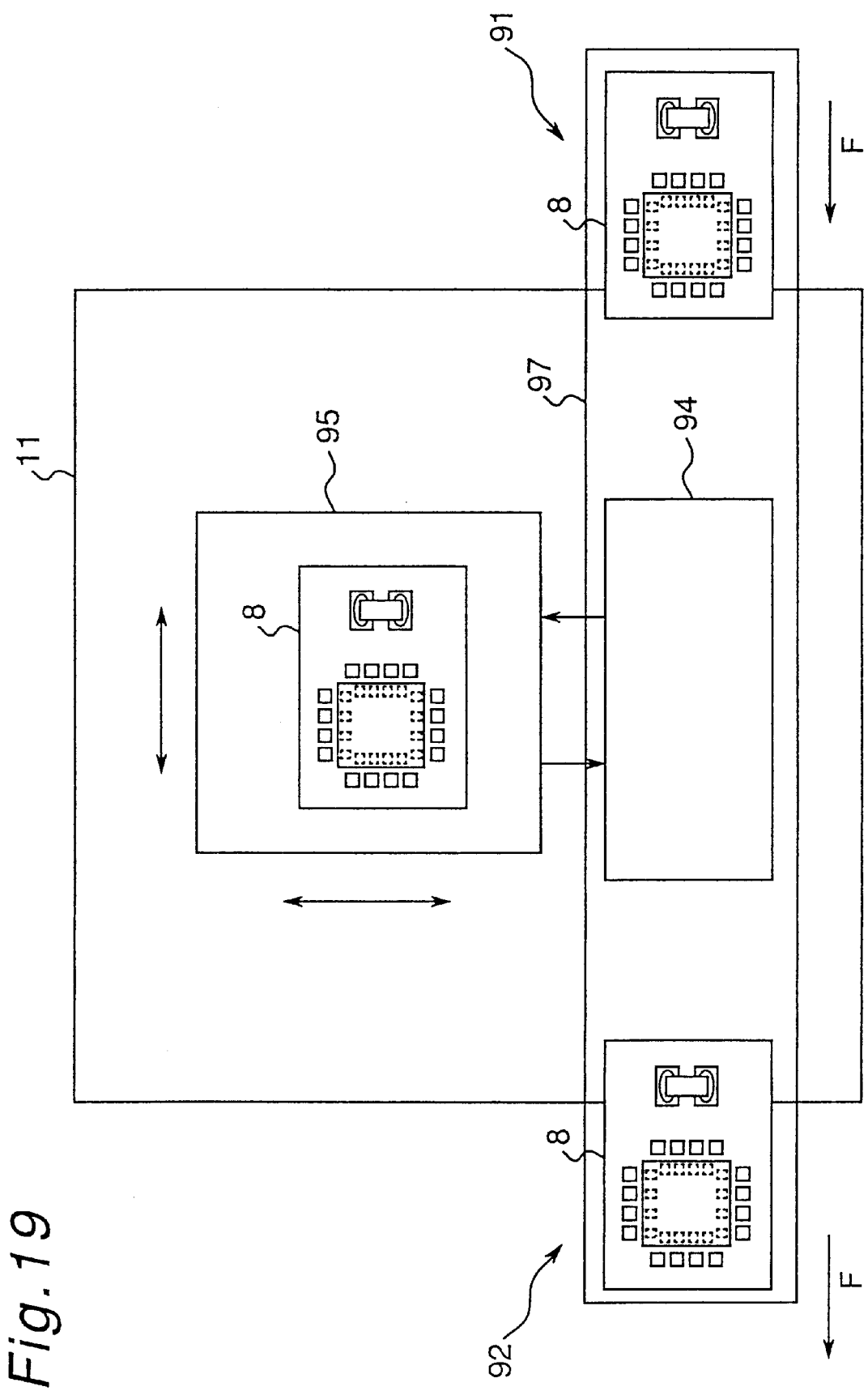
FIG. 19 is a schematic view explanatory of operational sequence of the automatic plasma processing system of FIG. 13.

FIG. 19 is a schematic view explanatory of operational sequence of the automatic plasma processing system S. The circuit boards 8 arranged in line are continuously carried to the loading portion 91 from an apparatus (not shown) of the preceding process. Then, the transfer unit 93 transports a leading one of the circuit boards 8 in the direction of the arrow F from the loading portion 91 to a central portion 94 of the conveyor 97 connecting the loading portion 91 and the unloading portion 92 and then, from the central portion 94 of the conveyor 97 to a plasma processing zone 95 so as to be placed on the X-Y table 11. Subsequently, the circuit board 8 is displaced in the plasma processing zone 95 by the X-Y table 11 in response to the command from the computer 14 such that the predetermined portion of the circuit board 8 is subjected to plasma processing by the plasma processing apparatus K. Thereafter, the circuit board 8 subjected to plasma processing is transported from the plasma processing zone 95 to the central portion 94 of the conveyor 97 and then, from the central portion 94 of the conveyor 97 to the unloading portion 92 in the direction of the arrow F by the transfer unit 93 so as to be carried to an apparatus (not shown) of the subsequent process, for example, a wire bonder.

The circuit board 8 referred to above is described below in more detail with reference to FIG. 20. The circuit board 8 has a portion 13 to be processed by the plasma processing apparatus K and a position of the portion 13 of the circuit board 8 is preliminarily inputted to the computer 14. Four positioning markers 40 are provided at four corners of the rectangular circuit board 8, respectively. A rectangular die portion 44 on which an electronic component such as an IC chip is mounted is provided on a surface of the circuit board 8. A plurality of bonding pads 45 are arranged side by side along each side of the die portion 44. Meanwhile, a plurality of bonding pads 9 are provided so as to surround the electronic component 43. Furthermore, a pair of lands 47 are formed on the surface of the circuit board 8. An electronic component 48 such as a chip resistor is bonded to the lands 47 by solder 49.

When surface treatment of the bonding pads 9 surrounding the electronic component 43 in the circuit board 8 is performed by the automatic plasma processing system S, the portion 13 is formed along a line surrounding the electronic component 43. When rectangular coordinates having an X-axis and a Y-axis are established on the circuit board 8 by using as reference points the positioning markers 40 located at predetermined positions, positions of a starting-point a, an end point b and intermediate points c, d and e of the portion 13 are expressed by X-Y coordinates, i.e. (X1, Y1), (X5, Y5), (X2, Y2), (X3, Y3) and (X4, Y4), respectively and are inputted to the computer 14. Meanwhile, a period for blowing plasma to the circuit board 8 from the plasma processing apparatus K is preliminarily inputted, as a processing period of the portion 13 of the circuit board 8, to the computer 14.

By employing the automatic plasma processing system S, plasma processing is restricted to only the bonding pads 9 surrounding the electronic component 43, so that effects of plasma processing on other portions requiring no plasma processing, for example, the electronic components 43 and 48, the solder 49 and resinous portions are lessened and thus, damage to these portions can be reduced. This feature is particularly effective for the article 7 having portions of poor heat resistance, for example, resin and solder. Furthermore, in case the plasma jet has a temperature of not more than 250° C., damage to the electronic components 43 and 48 such as the IC chip caused by plasma processing at the time of supply of electric power can be substantially eliminated. Meanwhile, by merely changing values of the coordinates of the starting-point a, the end point b and the intermediate points c, d and e, plasma processing can be simply changed to, for example, surface treatment of the bonding pads 45 prior to mounting of the electronic component 43 on the die portion 44 or surface treatment of the lands 47.

Meanwhile, by using the automatic plasma processing system S, soldering can also be performed without using flux. Flux is originally used for eliminating an oxide layer produced on a surface of solder, which exerts a harmful influence on bonding. However, the flux remains on the circuit board 8 and thus, should be eliminated by cleaning. On the other hand, in the automatic plasma processing system S, when the oxide layer is eliminated by plasma of a mixture of hydrogen and fluorine, soldering can be performed without using flux at all.

Figure 21:
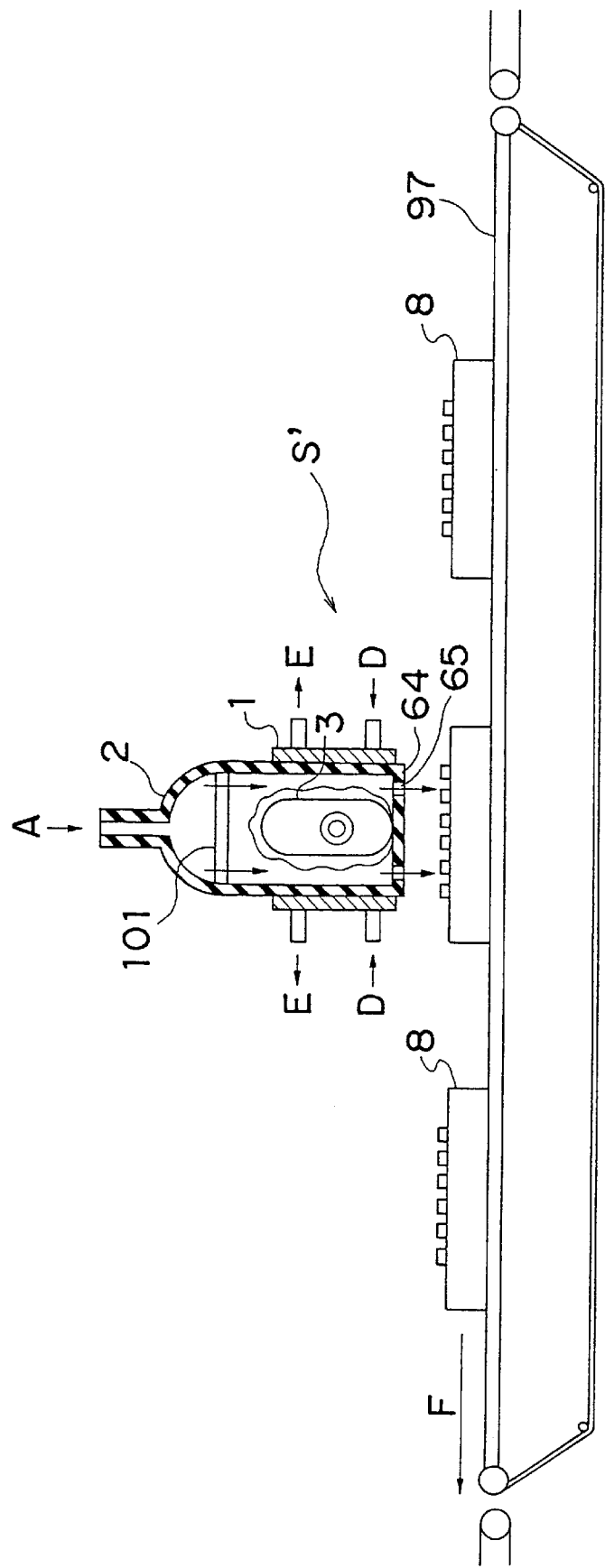
FIG. 21 is a schematic view showing a modified automatic plasma processing system of the present invention.

In addition, FIG. 21 shows a modified automatic plasma processing system S' of the present invention. The automatic plasma processing system S' includes the plasma processing apparatus shown in FIGS. 10 and 11 and the conveyor 97. In the automatic plasma processing system S', since the X-Y table 11 of the automatic plasma processing system S is eliminated and a number of the circuit boards 8 are sequentially transported through the plasma processing apparatus by the conveyor 97, the circuit board 8 is subjected to plasma processing only linearly. By adjusting feed rate of the conveyor 97 in accordance with the circuit boards 8, the plasma processing apparatus is capable of performing plasma processing of the circuit boards 8 continuously.

Figure 22:
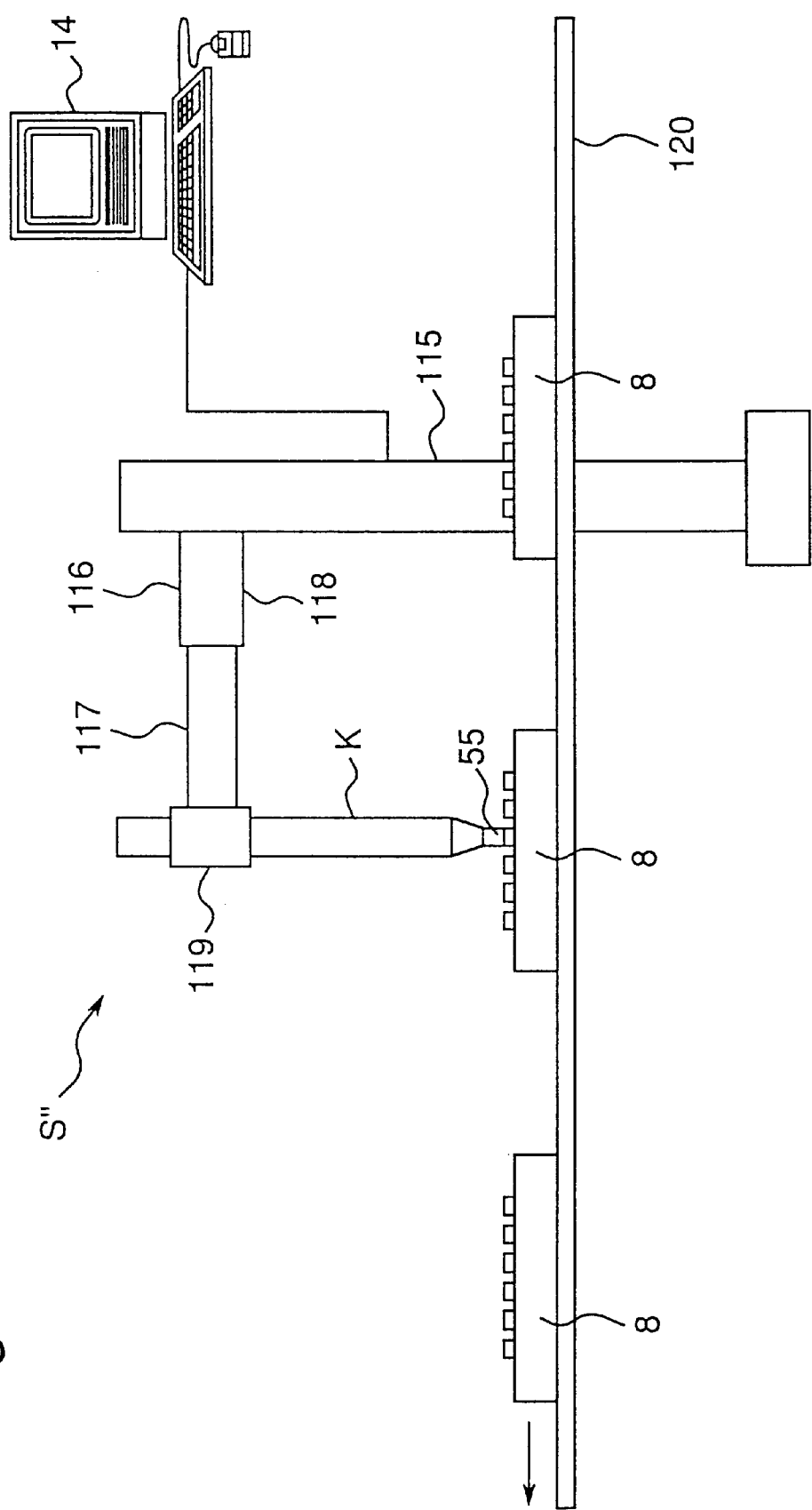
FIG. 22 is a schematic view showing a further modified automatic plasma processing system of the present invention.

Moreover; FIG. 22 shows a further modified automatic plasma processing system S" of the present invention. The automatic plasma processing system S" includes the plasma processing apparatus K, the computer 14, a column 115 and a support arm 116 constituted by a front support 117 and a rear support 118. A grip 119 for gripping the plasma processing apparatus K is provided at a distal end of the front support 117 and the front support 117 is retractably fitted into the rear support 116. The rear support 116 is vertically movably and rotatably mounted on the column 115. A number of the circuit boards 8 are sequentially transported by a belt conveyor 120. Therefore, in the automatic plasma processing apparatus S", the plasma processing apparatus K is automatically driven to a three-dimensional position relative to the circuit board 8 by the members 115, 116 and 119.

Hereinafter, examples 1 to 15 of the present invention are described.

(1) EXAMPLE 1

Plasma processing was performed by using the plasma processing apparatus K1 of FIGS. 1 and 2. The outer electrode 1 is formed by a mesh of stainless steel and is wound around the outer periphery of the reaction pipe 2. The outer electrode 1 is cooled by cooling air of 5° C. from the cooling fan 51. The inner face of the outer electrode 1 has a surface roughness Ra of 1,000 $\mu$m. The reaction pipe 2 is formed by a cylindrical tube of quartz having a dielectric constant of 3.6. The central electrode 3 is formed by a double pipe constituted by the electrode body pipe 25 and the supply pipe 26 which are both made of stainless steel. Pure water is employed as the refrigerant. A "Kapton" film which is a polyimide film produced by "Toray-du Pont" and has a thickness of 30 $\mu$m is employed as the article 7. A mixture of inert gas of helium and argon and reactive gas of oxygen is employed as the plasma producing gas. Flow rates of helium, argon and oxygen are, respectively, set at 1 l/min., 1 l/min. and 100 cc/min.

When a high-frequency electric power of 200 W having a frequency of 13.56 MHz is applied to the outer electrode 1 while the central electrode 3 is grounded and cooled by the refrigerant, plasma is produced and etching of the article 7 is performed by the plasma jet 55 blown at a flow velocity of 5 m/sec. from the blow-off outlet 21. A surface temperature of the central electrode 3 under plasma processing is measured by an infrared radiation thermometer produced by "CHINO" and stands at 230° C. By measuring time until a through-hole is formed on the article 7 after generation of plasma has reached a steady state, it was found that an etching rate is 20 $\mu$m/min. Neither thermal damage to the article 7 nor damage to the article 7 caused by streamer discharge was found.

(2) EXAMPLE 2

Plasma processing was performed by using the plasma processing apparatus K2 of FIGS. 3 and 4. The outer electrode 1 is formed by a cylindrical tube of copper as shown in FIG. 4 and is fitted around the outer periphery of the reaction pipe 2. The inner face of the outer electrode 1, which is brought into close contact with the reaction pipe 2, is worked by sandblasting so as to have a surface roughness Ra of 100 $\mu$m. The reaction pipe 2 is formed by a cylindrical tube of alumina having a dielectric constant of 9.7. The central electrode 3 is formed by a double pipe constituted by the electrode body pipe 25 and the supply pipe 26, which are both made of copper. A solution in which pure water and ethylene glycol are mixed with each other at a ratio of 1 to 1 is employed as the refrigerant. A "Kapton" film of 30 $\mu$m. in thickness is employed as the article 7. A mixture of inert gas of helium and argon and reactive gas of carbon dioxide is employed as the plasma producing gas. Flow rates of helium, argon and carbon dioxide are, respectively, set at 1 l/min. 2 l/min and 100 cc/min.

When a high-frequency electric power of 300 W having a frequency of 100 kHz is applied to the outer electrode 1 while the outer electrode 1 and the central electrode 3 are cooled by the refrigerant and the central electrode 3 is grounded, plasma is produced and etching of the article 7 is performed by the plasma jet 55 blown at a flow velocity of 8 m/sec. from the blow-off outlet 21. Surface temperatures of the outer electrode 1 and the central electrode 3 under plasma processing are, respectively, measured by an infrared radiation thermometer produced by "CHINO" and a thermocouple and both register 140° C. By measuring time until a through-hole is formed on the article 7, it was found that an etching rate is 21 μm/min. Neither thermal damage to the article 7 nor damage to the article 7 caused by streamer discharge was found.

(3) EXAMPLE 3

Plasma processing was performed by using the plasma processing apparatus K2 of FIGS. 3 and 4. The outer electrode 1 is formed by a cylindrical tube of brass as shown in FIG. 4 and is fitted around the outer periphery of the reaction pipe 2. The inner face of the outer electrode 1, which is brought into dose contact with the reaction pipe 2, is worked by sandblasting so as to have a surface roughness Ra of 50 μm. The reaction pipe 2 is formed by a cylindrical tube of magnesia having a dielectric constant of 8.9. The central electrode 3 is formed by a double pipe constituted by the electrode body pipe 25 and the supply pipe 26, which are both made of copper. A perfluorocarbon solution is employed as the refrigerant. A silicon wafer on which a negative resist ("OMR83" produced by "Tokyo Ouka Co., Ltd.") is coated to a thickness of 2 μm. is employed as the article 7. A mixture of helium and argon is employed as the plasma producing gas. Flow rates of helium and argon are, respectively, set at 1 l/min. and 2 l/min.

When a high-frequency electric power of 400 W having a frequency of 13.56 MHz is applied to the outer electrode 1 while the outer electrode 1 and the central electrode 3 are cooled by the refrigerant and the central electrode 3 is grounded, plasma is produced and the negative resist is separated from the article 7 by the plasma jet 55 blown at a flow velocity of 10 m/sec. from the blow-off outlet 21. Surface temperatures of the outer electrode 1 and the central electrode 3 under plasma processing are, respectively, measured by an infrared radiation thermometer produced by "CHINO" and a thermocouple and both read 120° C. By measuring depth distribution of a processed area and an unprocessed area of the article 7 by using a level difference meter "DEKTAKIIA" produced by "Sloan Technology", it was found that a separation speed is 1.5 μ/min. Neither thermal damage to the article 7 nor damage to the article 7 caused by streamer discharge was found.

(4) EXAMPLE 4

Plasma processing was performed by using the plasma processing apparatus K2 of FIGS. 3 and 4. The outer electrode 1 is formed by a cylindrical tube of brass as shown in FIG. 4 and is fitted around the outer periphery of the reaction pipe 2. The reaction pipe 2 is formed by a cylindrical tube of yttria partially stabilized zirconium having a dielectric constant of 11.0. The central electrode 3 is formed by a double pipe constituted by the electrode body pipe 25 and the supply pipe 26, which are both made of copper. Hydrofluoroether is employed as the refrigerant. A silicon wafer on which a film of cuprous oxide ($Cu_2O$) is deposited by sputtering is employed as the article 7. A mixture of helium and argon is employed as the plasma producing gas. Flow rates of helium and argon are, respectively, set at 1 l/min. and 2 l/min.

When a high-frequency electric power of 300 W having a frequency of 15 kHz is applied to the outer electrode 1 while the outer electrode 1 and the central electrode 3 are cooled by the refrigerant and the central electrode 3 is grounded, plasma is produced and reduction from cuprous oxide ($Cu_2O$) of the article 7 to copper (Cu) is performed by the plasma jet 55 blown at a flow velocity of 15 m/sec. from the blow-off outlet 21. A surface temperature of the central electrode 3 under plasma processing is measured by an infrared radiation thermometer produced by "CHINO" and stands at 150° C. From surface analysis of the article 7 by using X-ray photoelectron spectroscopy (XPS), it was found that a reduction speed is 0.2 μm/min. Neither thermal damage to the article 7 nor damage to the article 7 caused by streamer discharge was found.

(5) EXAMPLE 5

The circuit board 8 shown in FIG. 20 is employed as the article 7. The circuit board 8 is manufactured as follows. Initially, electrolytic gold plating is performed on a surface of a glass epoxy board so as to form on the board a circuit having a thickness of 0.5 μm. and including the bonding pads 9. Then, the board is subjected to screen printing of solder paste and resistor chips are mounted on the solder paste such that the resistor chips are joined to the board by a reflowing furnace. Then, epoxy series silver-palladium adhesive "84-1MI" produced by "Nihon Able Stick" is coated on the surface of the board and an IC chip (electronic component 43) is placed on the adhesive by a die mounter. The adhesive is hardened by heating the board at a temperature of 175° C. for 1.5 hr. and thus, the IC chip is mounted on the board. In order to evaluate damage to the IC chip caused by plasma processing at the time of supply of electric power, a chip in which a silicon dioxide layer of 10 nm in thickness and a polycrystalline silicon layer of 300 nm in thickness are formed on a silicon substrate is employed as the IC chip.

The bonding pads 9 of the circuit board 8 are subjected to plasma processing by the automatic plasma processing system S of FIG. 13 such that cleaning of a surface of the circuit board 8 is performed. In the automatic plasma processing system S, the plasma processing apparatus K2 is employed as the plasma processing apparatus K. Prior to start of plasma processing, rectangular coordinates having an X-axis and a Y-axis are established on the circuit board 8 by using as reference points the positioning markers 40 located at predetermined positions and positions of the starting-point a, the end point b and the intermediate points c, d and e corresponding to corners of the portion 13 substantially are expressed by X-Y coordinates, i.e. (X1, Y1), (X5, Y5), (X2, Y2), (X3, Y3) and (X4, Y4), respectively and are inputted to the computer 14. Meanwhile, a period for blowing plasma to the circuit board 8 from the plasma processing apparatus K is preliminarily inputted to the computer 14.

Initially, by recognizing a position of the positioning marker 40 by the detector 12 (image processing apparatus), the circuit board 8 is accurately transported to the plasma processing zone 95 on the X-Y table 11 by the transfer unit 93. Then, by displacing the circuit board 8 at a speed of 2 cm/sec. in the plasma processing zone 95 by the X Y table 11, the portion 13 of the circuit board 8 is subjected to plasma processing in the sequence of the points a, c, d, e and b by the plasma processing apparatus K. The circuit board 8 subjected to plasma processing is transported from the plasma processing zone 95 on the X-Y table 11 to the unloading portion 92 by the transfer unit 93. A mixture of inert gas of helium and argon and reactive gas of oxygen is employed as the plasma producing gas. Flow rates of helium, argon and oxygen are, respectively, set at 1 l/min. 1 l/min. and 50 cc/min. A high-frequency electric power of 200 W having a frequency of 100 kHz is applied to the outer electrode 1.

Surface analysis of the bonding pads 9 of the circuit board 8 by using X-ray photoelectron spectroscopy (XPS) revealed that carbon in the bonding pads 9 decreases, namely, carbon is found in the bonding pads 9 up to a depth of not more than mere 3 nm after plasma processing although carbon is found in the bonding pads 9 up to a depth of 30 nm prior to plasma processing.

(6) EXAMPLE 6

A mixture of helium and argon is employed as the plasma producing gas. Flow rates of helium and argon are, respectively, set at 1 l/min. and 1 l/min. A high-frequency electric power of 200 W having a frequency of 13.56 MHz is applied to the outer electrode 1. Since other processing conditions of the example 6 are similar to those of the example 5, the description is abbreviated for the sake of brevity.

Surface analysis of the bonding pads 9 of the circuit board 8 by using X-ray photoelectron spectroscopy (XPS) showed that carbon in the bonding pads 9 decreases, namely, carbon is found in the bonding pads 9 up to a depth of not more than mere 3 nm after plasma processing although carbon is found in the bonding pads 9 up to a depth of 30 nm prior to plasma processing.

(7) EXAMPLE 7

Electroless flush gold plating of 0.05 $\mu$m. in thickness is performed on the circuit including the bonding pads 9 on the glass epoxy board of the example 5 and then, the board is heated at 175° C. for 1.5 hr. Except for this, the circuit board 8 is prepared in the same manner as the example 5.

Meanwhile, a mixture of helium and hydrogen is employed as the plasma producing gas. Flow rates of helium and hydrogen are, respectively, set at 1 l/min. and 50 cc/min. A high-frequency electric power of 300 W having a frequency of 13.56 MHz is applied to the outer electrode 1. Since other processing conditions of the example 7 are similar to those of the example 5, the description is abbreviated for the sake of brevity.

Surface analysis of the bonding pads 9 of the circuit board a b by using X-ray photoelectron spectroscopy (XPS) revealed that after plasma processing, nickel hydroxide and nickel oxide in the bonding pads 9 decrease with appearance of only peak of metallic nickel although peaks of nickel hydroxide and nickel oxide appear mainly prior to plasma processing.

(8) EXAMPLE 8

A mixture of helium and argon is employed as the plasma producing gas. Flow rates of helium and argon are, respectively, set at 1 l/min. and 2 l/min. A high-frequency electric power of 100 W having a frequency of 15 kHz is applied to the outer electrode 1. Since other processing conditions of the example 8 are similar to those of the example 7, the description is abbreviated for the sake of brevity.

Surface analysis of the bonding pads 9 of the circuit board 8 by using X-ray photoelectron spectroscopy (XPS) showed that after plasma processing, nickel hydroxide and nickel oxide in the bonding pads 9 decrease with appearance of only peak of metallic nickel although peaks of nickel hydroxide and nickel oxide appear mainly prior to plasma processing.

(9) EXAMPLE 9

An alumina board is subjected to screen printing of silver-palladium paste and is baked so as to form the circuit including the bonding pads 9. Except for this, the circuit board 8 is prepared in the same manner as the example 5.

Meanwhile, a mixture of inert gas of helium and argon and reactive gas of hydrogen is employed as the plasma producing gas. Flow rates of helium, argon and hydrogen are, respectively, set at 1 l/min. 1 l/min. and 50 cc/min. A high-frequency electric power of 100 W having a frequency of 15 kHz is applied to the outer electrode 1. Since other processing conditions of the example 9 are similar to those of the example 5, the description is abbreviated for the sake of brevity.

Surface analysis of the bonding pads 9 of the circuit board 8 by using X-ray photoelectron spectroscopy (XPS) revealed that although peak of silver oxide is found prior to plasma processing, silver oxide in the bonding pads 9 decreases through change of the peak of silver oxide to that of metallic silver.

(10) EXAMPLE 10

Helium is employed as the plasma producing gas and a flow rate of helium is set at 2 l/min. A high-frequency electric power of 100 W having a frequency of 100 kHz is applied to the outer electrode 1. Since other processing conditions of the example 10 are similar to those of the example 9, the description is abbreviated for the sake of brevity.

Surface analysis of the bonding pads 9 of the circuit board 8 by using X-ray photoelectron spectroscopy (XPS) showed that although peak of silver oxide is found prior to plasma processing, silver oxide in the bonding pads 9 decreases through change of the peak of silver oxide to that of metallic silver.

(11) EXAMPLE 11

Plasma processing was performed by using the plasma processing apparatus K3 of FIG. 5. The outer electrode 1 is formed by a cylindrical tube of copper as shown in FIG. 4 and is interposed between the upper and lower portions 2a and 2b made of quartz so as to form the reaction pipe 2. The inner face of the outer electrode 1 is worked by sandblasting so as to have a surface roughness Ra of 50 $\mu$m. The central electrode 3 is formed by a double pipe constituted by the electrode body pipe 25 and the supply pipe 26 which are both made of copper. Perfluoroethylene is employed as the refrigerant. As shown in FIG. 5, a dielectric layer 67 made of titania (TiO$_2$)is formed on a bottom portion of the outer face of the central electrode 3 to a thickness of 500 $\mu$m. by flame spraying, The dielectric layer 67 may also be made of alumina, silicon dioxide, AlN, Si$_3$N$_4$, SiC, DLC, barium titanate, PZT or the like. A "Kapton" film of 50 $\mu$m. in thickness is employed as the article 7. A mixture of helium and oxygen is employed as the plasma producing gas. Flow rates of helium and oxygen are, respectively, set at 3 l/min. and 150 cc/min.

When a high-frequency electric power of 200 W having a frequency of 200 MHz is applied to the outer electrode 1 while the outer electrode 1 and the central electrode 3 are cooled by the refrigerant and the central electrode 3 is grounded, plasma is produced and etching of the article 7 is performed by the plasma jet 55 blown at a flow velocity of 25 m/sec. from the blow-off outlet 21. Surface temperatures of the outer electrode 1 and the central electrode 3 under plasma processing are, respectively, measured by an infrared radiation thermometer produced by "CHINO" and a thermocouple and both stand at 230° C. By measuring time until a through-hole is formed on the article 7, it was found that an etching rate is 35 $\mu$m/min. Neither thermal damage to the article 7 nor damage to the article 7 caused by streamer discharge was found.

(12) EXAMPLE 12

A semiconductor chip and a Ni/Au metallized substrate are employed as the article 7. Surface of Sn-Ag solder bumps and a metallized portion of the Ni-Au metallized substrate are employed at the portion 13 to be processed. A mixture of inert gas of helium and argon and reactive gas of oxygen and carbon tetrafluoride ($CF_4$) is employed as the plasma producing gas. Flow rates of helium, argon, oxygen and carbon tetrafluoride are, respectively, set at 0.5 l/min. 0.5 l/min. 25 cc/min. and 25 cc/min. A high-frequency electric power of 500 W having a frequency of 2.45 GHz is applied to the outer electrode 1 and a plasma processing time is set at 10 sec. Except for these factors, plasma processing is performed in the same manner as the example 5.

Subsequently, the semiconductor chip and the Ni/Au metallized substrate which have been subjected to plasma processing are registered in atmosphere and are subjected to reflowing by a belt furnace at a temperature of 23° C. in $N_2/N_2$ atmosphere having an oxygen concentration of 80 ppm. Prior to plasma processing, it was impossible to bond the semiconductor chip and the Ni/Au metallized substrate with each other. However, after plasma processing, it was possible to bond the semiconductor chip and the NI/Au metallized substrate with each other at a satisfactory bonding strength.

(13) EXAMPLE 13

The same article 7 as that of the example 3 was etched by using the plasma processing apparatus shown in FIGS. 8 and 9. Both the central electrode 3 and the outer electrode 1 are made of stainless steel. Both the outer face of the central electrode 3 and the inner face of the outer electrode 1 are worked by sandblasting so as to have a surface roughness Ra of 200 $\mu$m. Furthermore, a film of silicon dioxide is uniformly formed on the outer face of the central electrode 3 by plasma CVD. The reaction pipe 2 is made of quartz. Perfluorocarbon is used as the refrigerant and is circulated through the central electrode 3 and the outer electrode 1. A mixture of inert gas of helium and argon and reactive gas of oxygen is employed as the plasma producing gas. Flow rates of helium, argon and oxygen are, respectively, set at 1 l/min. 3 l/min. and 30 cc/min. A high-frequency electric power of 300 W having a frequency of 60 MHz is applied to the outer electrode 1 such that the negative resist is separated from the silicon wafer by the plasma jet 55 blown at a flow velocity of 10 m/sec. from the blow-off outlet 21. Etching rate of the negative resist measured by a level difference meter "DEK-TAKIIA" produced by "Sloan Technology" reads 5.0 $\mu$m/min. Neither thermal damage to the article 7 nor damage to the article 7 caused by streamer discharge was found.

Surface analysis by X-ray photoelectron spectroscopy (XPS) revealed that carbon in the bonding pads 9 is eliminated substantially completely.

Bonding strength is 5.1 g prior to plasma processing and 12.2 g after plasma processing.

Meanwhile, separation mode in this example is as follows. Prior to plasma processing, the wire is not bonded to the bonding pads 9. After plasma processing, the wire is severed at its central portion.

Furthermore, defective rate due to damage to the IC chip caused by plasma processing at the time of supply of electric power is 0%.

(14) EXAMPLE 14

Plasma processing was performed by using the automatic plasma processing system S' shown in FIG. 21. In the automatic plasma processing system S', the reaction pipe 2 is made of quartz, while the central electrode 3 and the outer electrode 1 are made of stainless steel. An OMPAC (over molded pad array carrier) type BGA board in which a resist "PSR-4000 AVS5" produced by "Taiyo Ink Co., Ltd." is coated on a BT substrate of 0.5 mm in thickness to a thickness of 40 $\mu$m is employed as the article 7 and measures 50 by 200 mm. Gold plating is performed at a portion of the BGA board and the same IC chip as that of the example 5 is mounted on the board. Both the outer face of the central electrode 3 and the inner face of the outer electrode 1 are worked by sandblasting so as to have a surface roughness Ra of 100 $\mu$m. Feed rate of the conveyor 97 is 2 cm/sec. A mixture of helium, argon and oxygen is employed as the plasma producing gas. Flow rates of helium, argon and oxygen are, respectively, set at 3 l/min., 5 l/min. and 100 cc/min. Ion exchange water is employed as the refrigerant. A high-frequency electric power of 500 W having a frequency of 13.56 MHz is applied to the outer electrode 1 and the plasma jet 55 is blown at a flow velocity of 15 m/sec. from the blow-off outlet 21.

Performances of the board subjected to plasma processing as described above were compared with those of an unprocessed board. A contact angle of water at the resist resisters 80° in the unprocessed board but drops to 8° in the processed board. Measurement of bonding strength of the gold plating portion and the IC chip are subjected to wire bonding of 1,000 wires revealed that the unprocessed board has an average bonding strength of 5.1 g but the processed board has an average bonding strength of 12.2 g. Meanwhile, molding compound produced by "Plascon" is molded on the board at 175° C. so as to be formed into a shape of a truncated cone having a bottom surface area of 1 $cm^2$. Shearing separation strength of the molded item is 2 Mpa in the unprocessed board but rises sharply to 10 Mpa in the processed board.

Meanwhile, separation mode in this example is as follows. Prior to plasma processing, the wire is not bonded to the bonding pads 9. After plasma processing, the wire is severed at its central portion.

Furthermore, defective rate due to damage to the IC chip caused by plasma processing at the time of supply of electric power is 0%.

(15) EXAMPLE 15

The same article 7 as that of the example 3 as etched under the same conditions as those of the example 3 by using the plasma processing apparatus shown in FIG. 12.

In case the cap 102 is not mounted on the distal end of the reaction pipe 2, it takes about 10 min. for etching rate to reach a steady state. On the other hand, in case the cap 102 is mounted on the distal end of the reaction pipe 2, etching rate reaches a steady state in less than 1 min.

Hereinafter, comparative examples a to g are described in comparison with the examples 1 to 15 of the present invention.

[a] COMPARATIVE EXAMPLE a

Figure 25:
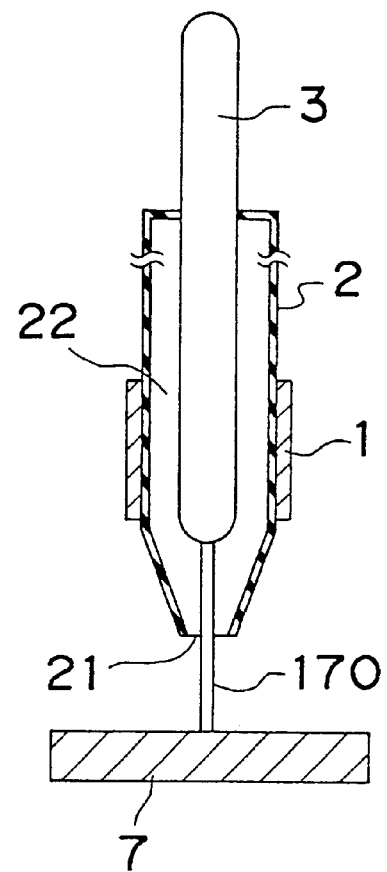
FIG. 25 is a sectional view showing a further defect in the prior art plasma processing apparatus of FIG. 24.

Except that only the central electrode 3 is cooled by the refrigerant, plasma processing was performed under the same conditions as those of the example 3. Since a streamer discharge 170 shown in FIG. 25 occurs after several min. from start of glow discharge, it is impossible to etch the article 7 uniformly, It was found that surface of the outer electrode 1 is oxidized and turns black.

[b] COMPARATIVE EXAMPLE b

Except that the outer electrode 1 and the central electrode 3 are not cooled by the refrigerant and an electric power of 250 W is applied to the outer electrode 1, plasma processing was performed in the same manner as the example 3. It was found that an electric power of more than 250 W causes heat fusion, etc. and therefore, cannot be applied to the outer electrode 1. Although a trial for separating the negative resist from the article 7 was conducted as in the example 3, it was impossible to separate the negative resist from the article 7 due to carbonization of the negative resist.

[c] COMPARATIVE EXAMPLE c

Except that the outer electrode 1 and the central electrode 3 are not cooled by the refrigerant and an electric power of 250 W is applied to the outer electrode 1, plasma processing was performed in the same manner as the example 4. It was found that an electric power of more than 250 W causes heat fusion, etc. and therefore, cannot be applied to the outer electrode 1. Although a trial for reducing cuprous oxide ($Cu_2O$) to copper (Cu) was conducted as in the example 4, the silicon wafer was oxidized through heating in air and turned black.

[d] COMPARATIVE EXAMPLE d

Figure 23:
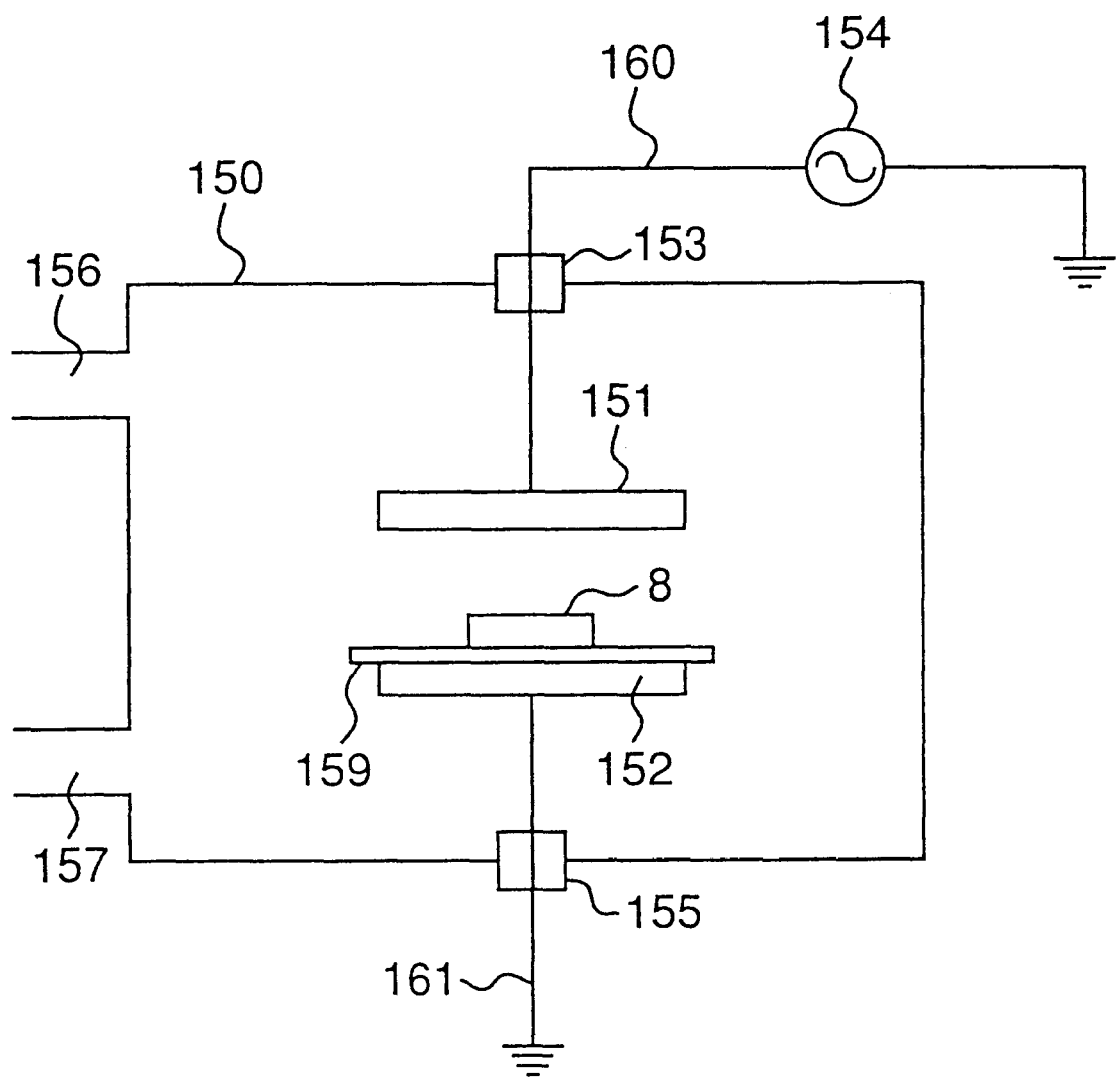
FIG. 23 is a schematic sectional view of a prior art plasma processing apparatus.
Figure 24:
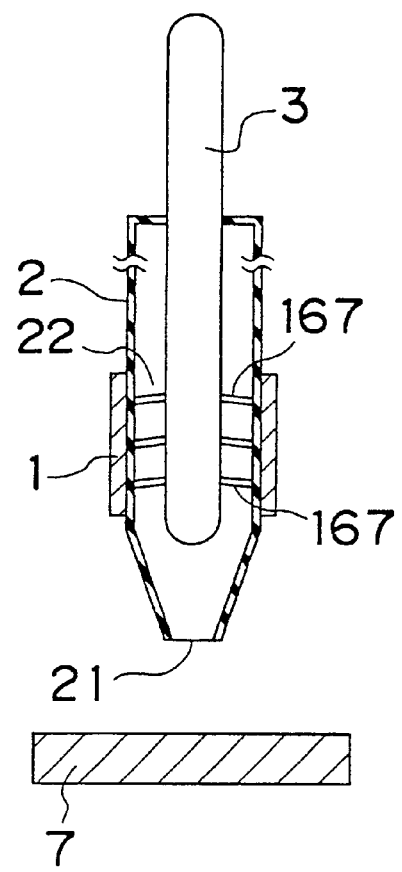
FIG. 24 is a sectional view showing a defect in another prior art plasma processing apparatus.

The circuit board 8 of the example 5 was subjected to plasma processing by a conventional plasma processing apparatus shown in FIG. 23. The conventional plasma processing apparatus includes a reaction tank 150 in which an upper electrode 151 and a lower electrode 152 are disposed so as to confront each other. An electrical insulator 153 is mounted on an upper face of the reaction tank 150. The upper electrode 151 and an AC power source 154 are connected to each other by a wire 160 extending through the electrical insulator 153. The AC power source 154 is grounded. Meanwhile, an electrical insulator 155 is mounted on a lower face of the reaction tank 150. The lower electrode 152 is grounded by a wire 161 extending through the electrical insulator 155. A solid dielectric member 159 is provided on an, upper face of the lower electrode 152. Furthermore, a gas inlet 156 is provided at an upper portion of the reaction tank 150, while a gas outlet 157 is provided at a lower portion of the reaction tank 150.

The circuit board 8 is placed on the solid dielectric member 159. When not only the plasma producing gas is introduced into the reaction tank 150 from the gas inlet 156 but an AC voltage is applied between the upper electrode 151 and the lower electrode 152, the circuit board 8 is subjected to plasma processing. The same mixed gas as that of the example 5 is employed as the plasma producing gas and flow rates of its constituent gases are set at the same values as those of the example 5. The same high-frequency electric power as that of the outer electrode 1 in the example 5 is applied to the upper electrode 151. In addition, an interior of the reaction tank 150 is set at a pressure of 760 Torr and a processing period is set at 2 min.

Surface analysis of the bonding pads 9 of the circuit board 8 by using X-ray photoelectron spectroscopy (XPS) revealed that processing effects are inferior to those of the example 5 in that carbon is found in the bonding pads 9 up to a depth of 30 nm prior to plasma processing and up to a depth of 10 nm after plasma processing.

[e] COMPARATIVE EXAMPLE e

The same circuit board 8 as that of the example 7 is subjected to plasma processing in the same manner as the comparative example d by using the conventional plasma processing apparatus of FIG. 23. The same mixed gas as that of the example 7 is employed as the plasma producing gas and flow rates of its constituent gases are set at the same values as those of the example 7. The same high-frequency electric power as that of the outer electrode 1 in the example 7 is applied to the upper electrode 151. In addition, an interior of the reaction tank 150 is set at a pressure of 760 Torr and a processing period is set at 2 min.

Surface analysis of the bonding pads 9 of the circuit board 8 by using X-ray photoelectron spectroscopy (XPS) showed that processing effects are inferior to those of the example 7 in that peaks of nickel hydroxide and nickel oxide are found also after plasma processing.

[f] COMPARATIVE EXAMPLE f

The same circuit board 8 as that of the example 10 is subjected to plasma processing in the same manner as the comparative example d by using the conventional plasma processing apparatus of FIG. 23. The same mixed gas as that of the example 10 is employed as the plasma producing gas and flow rates of its constituent gases are set at the same values as those of the example 10. The same high-frequency electric power as that of the outer electrode 1 in the example 10 is applied to the upper electrode 151. In addition, an interior of the reaction tank 150 is set at a pressure of 760 Torr and a processing period is set at 2 min.

Surface analysis of the bonding pads 9 of the circuit board 8 by using X-ray photoelectron spectroscopy (XPS) revealed that processing effects are inferior to those of the example 10 in that peak of silver oxide is partially found also after plasma processing.

[g] COMPARATIVE EXAMPLE g

It was found that the circuit board 8 is damaged by heat when the circuit board 8 is subjected to plasma processing under the same processing conditions as those of the examples 5 to 9 except that the outer electrode 1 and the central electrode 3 are not cooled by the refrigerant.

Then, in the circuit boards 8 subjected to plasma processing in the examples 5 to 10 and the comparative examples d to f respectively, the IC chip and the bonding pads 9 were subjected to wire bonding at an electric power of 0.7 W and at a temperature of 150° C. for 20 msec. by a wire bonder "FP-118AP" produced by "Kaijyo Co., Ltd." Bonding strength of separation mode of the thus bonded IC chip and bonding pads 9 are evaluated. Meanwhile, in order to evaluate damage to the IC chip caused by plasma processing at the time of supply of electric power, a chip in which a silicon dioxide layer of 10 nm in thickness and a polycrystalline silicon layer of 300 nm in thickness are formed on a silicon substrate is employed as the IC chip by using an current density of $1 \ nA/10 \ \mu m^2$ and a breakdown voltage of less than 8 V. The results are summarized as follows.

(1) EXAMPLES 5 and 6 vs. COMPARATIVE EXAMPLE d i) Surface analysis by XPS

In the examples 5 and 6, carbon on the surface is eliminated substantially completely.

On the other hand, in the comparative example d, carbon remains partially.

ii) Bonding strength

<Prior to plasma processing >

Bonding strength is 5.1 g in the examples 5 and 6 and the comparative example d, <After plasma processing>

Bonding strength is 11.8 g and 12.6 g in the examples 5 and 6, respectively, while bonding strength is 7.8 g in the comparative example d.

iii) Separation mode

<Prior to plasma processing>

The wire is not bonded to the bonding pads 9 in the examples 5 and 6 and the comparative example d.

<After plasma processing>

The wire is severed at its central portion in the examples 5 and 6, while separation takes place at a boundary between the wire and the bonding pads 9 in the comparative example d.

iv) Damage to the IC chip at the time of supply of electric power

Defective rate due to damage to the IC chip caused by plasma processing at the time of supply of electric power is 0% in the examples 5 and 6 but is 5% in the comparative example d.

(2) EXAMPLES 7 and 8 vs. COMPARATIVE EXAMPLE e i) Surface analysis by XPS

In the examples 7 and 8, most of nickel compounds on the surface are eliminated and the residual nickel compounds such as nickel oxide and nickel hydroxide prior to plasma processing are changed to metallic nickel.

On the other hand, in the comparative example e, nickel oxide and nickel hydroxide remain.

ii) Bonding strength

<Prior to plasma processing>

No bonding takes place in the examples 7 and 8 and the comparative example e.

<After plasma processing>

Bonding strength is 10.8 g and 11.6 g in the examples 7 and 8, respectively, while bonding strength is 4.5 g in the comparative example e.

iii) Separation mode <Prior to plasma processing>

The wire is not bonded to the bonding pads 9 in the examples 7 and 8 and the comparative example e <After plasma processing>

The wire is severed at its central portion in the example 7 and a cut is made between the wire and a solder ball in the example 8, while separation takes place at a boundary between the wire and the bonding pads 9 in the comparative example e.

iv) Damage to the IC chip at the time of supply of electric power

Defective rate due to damage to the IC chip caused by plasma processing at the time of supply of electric power is 0% in the examples 7 and 8 but is 7% in the comparative example e.

(3) EXAMPLES 9 AND 10 VS. COMPARATIVE EXAMPLE f i) Surface analysis by XPS

In the examples 9 and 10, silver oxide is changed to silver.

On the other hand, in the comparative example [f]silver oxide remains partially and carbon remains partially.

ii) Bonding strength

<Prior to plasma processing>

Bonding strength is 2.8 g in the examples 9 and 10 and the comparative example f <After plasma processing>

Bonding strength is 8.9 g and 9.2 g in the examples 9 and 10, respectively, while bonding strength is 3.8 g in the comparative example f iii) Separation mode <Prior to plasma processing>

The wire is not bonded to the bonding pads 9 in the examples 9 and 10 and the comparative example f <After plasma processing>

The wire is severed at its central portion in the example 9 and a cut is made between the mire and a solder ball in the example 10, while separation takes place at a boundary between the wire and the bonding pads 9 in the comparative example f iv) Damage to the IC chip at the time of supply of electric power Defective rate due to damage to the IC chip caused by plasma processing at the time of supply of electric power is 0% in the examples 9 and 10 but is 6% in the comparative example f.

As is apparent from the above summarized results, if plasma processing is performed based on the examples 5 and 6, the examples 7 and 8 and the examples 9 and 10, bonding strength and separation mode are improved and fraction defective due to damage to the IC chip caused by plasma processing at the time of supply of electric power is reduced greatly in comparison with the comparative examples d, e and f respectively.

As is clear from the foregoing description, the plasma processing apparatuses K1 to K4 include the cooling means for cooling at least one of the outer electrode and the central electrode. Therefore, even if the plasma is produced under atmospheric pressure by a high AC voltage having a high frequency, rise of temperature of the outer electrode or the central electrode can be restrained, so that extreme rise of temperature of the plasma can be prevented and thus, thermal damage to the article can be lessened.

Meanwhile, in the plasma processing apparatuses K1 to K4, since the roughened inner face of the outer electrode acts as the discharge uniformizing means for uniformizing the glow discharge, uniform glow discharge is induced in the discharge space and induction of streamer discharge can be restrained. Consequently, damage to the article caused by the streamer discharge can be lessened.

If the central electrode is coated with dielectric material, it is possible to induce stable glow discharge in the discharge space under atmospheric pressure.

Furthermore, generally, in conventional plasma processing apparatuses, a diameter of the discharge space is identical with that of the outlet of the reaction pipe. Therefore; if flow velocity of the plasma is raised, volume of the discharge space should be reduced, for example, the central electrode has a radius of 0.5 mm and the reaction pipe has a radius of 0.85 mm as disclosed in Japanese Patent Laid-Open Publication No. 4-212253 (1992), so that it is difficult to cool the electrodes. In the present invention, radius of the reaction pipe is increased and the reaction pipe is tapered as the converging portion so as to decrease in diameter towards the blow-off outlet in order to solve such a problem of the conventional plasma processing apparatuses such that flow velocity of the plasma at the blow-off outlet is raised in the present invention.

Meanwhile, the converging portion may be replaced by the arrangement in which the bottom wall for closing the discharge space is provided at the distal end of the reaction pipe and the pore acting as the blow-off outlet is formed at a portion of the bottom wall. In this arrangement, since the discharge space is brought closer to the blow-off outlet than the converging portion, the plasma can be blown to the article before active species such as radicals and ions in the plasma are extinguished, so that processing effects are enhanced greatly.

In addition, since the automatic plasma processing system includes the plasma processing apparatus for performing plasma processing of the article under atmospheric pressure, the automatic plasma processing system is capable of performing plasma processing of a number of the articles continuously and efficiently by sequentially transporting the articles.

The present disclosure relates to subject matter contained in priority Japanese Patent Application Nos. HEI 9-333325, filed on Dec. 3, 1997, and HEI 10-344735, filed on Dec. 3, 1998, the contents of which are both herein expressly incorporated by reference their entireties.

What is claimed is:

1. A plasma processing apparatus for performing plasma processing of an article, comprising:
   a central electrode having an outer surface;
   a tubular metallic outer electrode surrounding said central electrode and having an inner surface, a distance between said inner surface of said outer electrode and said outer surface of said central electrode ranging from approximately 1 mm to approximately 10 mm;
   a cylindrical tubular reaction pipe comprising an electrically insulative material disposed between said central electrode and said outer electrode so as to electrically insulate said central electrode and said outer electrode from each other, said outer electrode fitted about an outer periphery of said reaction pipe;
   a gas supply for supplying a plasma producing gas to a discharge space defined between said central electrode and said outer electrode in said reaction pipe;
   an AC power source for applying an AC voltage between said central electrode and said outer electrode; and
   a cooler for cooling said central electrode and said outer electrode;
   wherein the plasma producing gas is supplied to the discharge space by said gas supply, and AC voltage is applied between said central electrode and said outer electrode by said AC power source so as to generate a glow discharge in the discharge space under atmospheric pressure such that a plasma jet is blown to the article from a blow-off outlet of said reaction pipe.

2. A plasma processing apparatus as claimed in claim 1, wherein at least one of an inner face of the outer electrode and an outer face of the central electrode is roughened.

3. A plasma processing apparatus as claimed in claim 2, wherein an arithmetic mean of surface roughness of said at least one of the inner face of the outer electrode and the outer face of the central electrode ranges from 10 to 1,000 $\mu$m.

4. A plasma processing apparatus as claimed in claim 2, wherein the inner face of the outer electrode is brought into close contact with an outer face of the reaction pipe.

5. A plasma processing apparatus for performing plasma processing of an article, comprising:
   a central electrode,
   a tubular outer electrode which is provided so as to surround the central electrode;
   a tubular reaction pipe which is disposed between the central electrode and the outer electrode so as to electrically insulate the central electrode and the outer electrode from each other;
   a gas supply for supplying a plasma producing gas to a discharge space defined between the central electrode and the outer electrode in the reaction pipe;
   an AC power source for applying an AC voltage between the central electrode and the outer electrode;
   wherein not only the plasma producing gas is supplied to the discharge space by the gas supply but the AC voltage is applied between the central electrode and the outer electrode by the AC power source so as to generate a glow discharge in the discharge space under atmospheric pressure such that a plasma jet is blown to the article from a blow-off outlet of the reaction pipe; and
   a cooler for cooling the central electrode and the outer electrode; and
   a barrier for preventing entry of external air into the reaction pipe when generation of the glow discharge in the reaction pipe is stopped.

6. A plasma processing apparatus as claimed in claim 5, wherein the means is formed by an air sealing mechanism including a cap mounted on a distal end of the reaction pipe through a seal and a cylinder for pressing the cap against the blow-off outlet through the seal.

7. A plasma processing apparatus as claimed in claim 5, wherein the means is formed by dried air circulated through the reaction pipe.

8. A plasma processing apparatus as claimed in claim 1, wherein the central electrode is formed by a double pipe constituted by a first pipe and a second pipe extending in the first pipe along an axis of the first pipe.

9. A plasma processing apparatus as claimed in claim 1, wherein a liquid refrigerant having antifreezing property at a temperature of 0° C. electrical insulating property and corrosion resistance is used as the cooling means.

10. A plasma processing apparatus as claimed in claim 1, wherein the central electrode is coated with dielectric material.

11. A plasma processing apparatus as claimed in claim 10, wherein coating of the dielectric material is performed by flame spraying.

12. A plasma processing apparatus as claimed in claim 10, wherein coating of the dielectric material is performed by chemical vapor deposition (CVD) or physical vapor deposition (PVD) so as to form a -dielectric film on the central electrode.

13. A plasma processing apparatus as claimed in claim 1, wherein the cooling means is provided with a temperature control means for controlling temperature of the central electrode.

14. A plasma processing apparatus as claimed in claim 1, wherein the reaction pipe is tapered so as to decrease in diameter towards the blow-off outlet.

15. A plasma processing apparatus for performing plasma processing of an article, comprising:
   a central electrode,
   a tubular outer electrode which is provided so as to surround the central electrode;

a tubular reaction pipe which is disposed between the central electrode and the outer electrode so as to electrically insulate the central electrode and the outer electrode from each other;

a gas supply for supplying a plasma producing gas to a discharge space defined between the central electrode and the outer electrode in the reaction pipe;

an AC power source for applying an AC voltage between the central electrode and the outer electrode;

wherein not only the plasma producing gas is supplied to the discharge space by the gas supply but the AC voltage is applied between the central electrode and the outer electrode by the AC power source so as to generate a glow discharge in the discharge space under atmospheric pressure such that a plasma jet is blown to the article from a blow-off outlet of the reaction pipe; and a cooler for cooling the central electrode and the outer electrode;

a bottom wall for closing the discharge space provided at a distal end of the reaction pipe; and a plurality of pores acting as the blow-off outlet formed at a portion of said bottom wall.

16. An automatic plasma processing system for automatically performing plasma processing of an article, comprising:

a plasma processing apparatus for performing plasma processing of the article; and a mechanism for automatically driving the plasma processing apparatus to a three-dimensional position relative to the article.

17. An automatic plasma processing system for automatically performing plasma processing of an article, comprising:

a plasma processing apparatus for performing plasma processing of the article;

a transport member for transporting the article; and a control means which is electrically connected to the plasma processing apparatus and the transport member;

wherein the plasma processing apparatus comprises:

a central electrode;

a tubular outer electrode which is provided so as to surround the central electrode;

a tubular reaction pipe which is disposed between the central electrode and the outer electrode so as to electrically insulate the central electrode and the outer electrode from each other;

a gas supply means for supplying a plasma producing gas to a discharge space defined between the central electrode and the outer electrode in the reaction pipe;

an AC power source for applying an AC voltage between the central electrode and the outer electrode;

wherein not only the plasma producing gas is supplied to the discharge space by the gas supply means but the AC voltage is applied between the central electrode and the outer electrode by the AC power source so as to generate a glow discharge in the discharge space under atmospheric pressure such that a plasma jet is blown to the article from a blow-off outlet of the reaction pipe; and a cooling means for cooling the central electrode and the outer electrode.

18. An automatic plasma processing system as claimed in claim 17, wherein at least one of an inner face of the outer electrode and an outer face of the central electrode is roughened.

19. An automatic plasma processing system as claimed in claim 18, wherein an arithmetic mean of surface roughness of said at least one of the inner face of the outer electrode and the outer face of the central electrode ranges from 10 to 1,000 $\mu$m.

20. A plasma processing apparatus for performing plasma processing of an article, comprising:

a central electrode, a tubular outer electrode which is provided so as to surround the central electrode;

a tubular reaction pipe which is disposed between the central electrode and the outer electrode so as to electrically insulate the central electrode and the outer electrode from each other;

a gas supply for supplying a plasma producing gas to a discharge space defined between the central electrode and the outer electrode in the reaction pipe;

an AC power source for applying an AC voltage between the central electrode and the outer electrode;

wherein not only the plasma producing gas is supplied to the discharge space by the gas supply but the AC voltage is applied between the central electrode and the outer electrode by the AC power source so as to generate a glow discharge in the discharge space under atmospheric pressure such that a plasma jet is blown to the article from a blow-off outlet of the reaction pipe; and a cooler for cooling the central electrode and the outer electrode; and a heater for heating the reaction pipe and configured to remove impurities contained in air, the impurities being absorbed on an inside of the reaction pipe during cessation of operation of the plasma processing apparatus.

21. A plasma processing method using a plasma processing apparatus for performing plasma processing of an article, the plasma processing apparatus comprising:

a central electrode comprising a double pipe formed by a first pipe and a second pipe, said second pipe substantially coaxially disposed within said first pipe;

a tubular outer electrode which is provided so as to surround the central electrode, a tubular reaction pipe which is disposed between the central electrode and the outer electrode so as to electrically insulate the central electrode and the outer electrode from each other;

a gas supply for supplying a plasma producing gas to a discharge space defined between the central electrode and the outer electrode in the reaction pipe; and an AC power source for applying an AC voltage between the central electrode and the outer electrode, wherein not only the plasma producing gas is supplied to the discharge space by the gas supply but the AC voltage is applied between the central electrode and the outer electrode by the AC power source so as to generate a glow discharge in the discharge space under atmospheric pressure such that a plasma jet is blown to the article from a blow-off outlet of the reaction pipe;

wherein the central electrode and the outer electrode are cooled.

22. An automatic plasma processing method using an automatic plasma processing system for automatically performing plasma processing of an article, the automatic plasma processing system having a plasma processing apparatus for performing plasma processing of the article, the apparatus having a central electrode comprising a double pipe formed by a first pipe and a second pipe, the second pipe substantially coaxially disposed within the first pipe, the plasma processing further having a transport member for transporting the article, and a controller electrically connected to the plasma processing apparatus and the transport member, the automatic plasma processing method comprising:

transporting, on the basis of a position of the article preliminarily inputted to the controller, the article from a loading portion to a plasma processing zone by the transport member;

performing plasma processing of a predetermined portion of the article by he plasma processing apparatus by displacing the article in the plasma processing zone by the transport member; and transporting the article subjected to plasma processing from the plasma processing zone to an unloading portion by the transport member.

23. An automatic plasma processing method using an automatic plasma processing system for automatically performing plasma processing of a plurality of articles, the automatic plasma processing system having a plasma processing apparatus for performing plasma processing of each of the articles, a transport member for transporting each of the articles, and a controller electrically connected to the plasma processing apparatus and the transport member;

the automatic plasma processing method comprising:

transporting, on the basis of a position of each of the articles preliminarily inputted to the controller, each of the articles to a predetermined position by the transport member, displacing each of the articles by the transport member on the basis of a signal from the controller so as to blow a plasma jet from the plasma processing apparatus to a predetermined portion of each of the articles; and stopping the blowing of the plasma jet from the plasma processing apparatus upon lapse of a fixed period on the basis of a further signal from the controller so as to set the plasma processing apparatus at rest by mounting a cap on a blow-off outlet by pressing of the cap against the blow-off outlet by a cylinder until a restart signal is given by the controller.

24. An automatic plasma processing method using an automatic plasma processing system for automatically performing plasma processing of an article, the automatic plasma processing system having a plasma processing apparatus for performing plasma processing of the article, the apparatus having a central electrode comprising a double pipe formed by a first pipe and a second pipe, the second pipe substantially coaxially disposed within the first pipe, the plasma processing system further having a transport member for transporting the article, the automatic plasma processing method comprising:

transporting the article from a preceding process by the transport member;

continuously conveying the article to a plasma processing zone by the transport member so as to blow a plasma jet from the plasma processing apparatus to the article; and transporting the article to a subsequent process by the transport member.

\* \* \* \* \*

UNITED STATES PATENT AND TRADEMARK OFFICE
CERTIFICATE OF CORRECTION

PATENT NO. : 6,429,400 B1
DATED : August 6, 2002
INVENTOR(S) : Y. Sawada et al.

It is certified that error appears in the above-identified patent and that said Letters Patent is hereby corrected as shown below:

Column 27,
Line 39, after "material" insert -- and --.

Column 31,
Line 13, "he" should be -- the --.

Signed and Sealed this

Twenty-ninth Day of April, 2003

JAMES E. ROGAN
*Director of the United States Patent and Trademark Office*